United States Patent
Maki et al.

(10) Patent No.: US 12,149,224 B2
(45) Date of Patent: Nov. 19, 2024

(54) BULK ACOUSTIC WAVE RESONATOR ON MULTI-LAYER PIEZOELECTRIC SUBSTRATE ACOUSTIC WAVE DEVICE

(71) Applicant: Skyworks Solutions, Inc., Irvine, CA (US)

(72) Inventors: Keiichi Maki, Suita (JP); Hironori Fukuhara, Ibaraki (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 941 days.

(21) Appl. No.: 16/951,483

(22) Filed: Nov. 18, 2020

(65) Prior Publication Data
US 2021/0159876 A1      May 27, 2021

Related U.S. Application Data

(60) Provisional application No. 62/938,556, filed on Nov. 21, 2019, provisional application No. 62/938,544, (Continued)

(51) Int. Cl.
*H03H 9/02*      (2006.01)
*H03H 9/10*      (2006.01)
(Continued)

(52) U.S. Cl.
CPC .... *H03H 9/02574* (2013.01); *H03H 9/02015* (2013.01); *H03H 9/02102* (2013.01); (Continued)

(58) Field of Classification Search
CPC ........... H03H 9/02574; H03H 9/02015; H03H 9/02102; H03H 9/02228; H03H 9/02834; (Continued)

(56) References Cited

U.S. PATENT DOCUMENTS 7,583,161 B2    9/2009 Tanaka
9,106,199 B2    8/2015 Deguet et al.
(Continued)

FOREIGN PATENT DOCUMENTS

CN      109245742 A    *    1/2019

OTHER PUBLICATIONS

Machine English Translation of CN109245742A Published on Jan. 18, 2019 (Year: 2019).*

(Continued)

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

An acoustic wave filter component can include an acoustic wave device including a multi-layer piezoelectric substrate. The multi-layer piezoelectric substrate can include at least a support substrate and a piezoelectric layer. The acoustic wave device can include an interdigital transducer electrode on the piezoelectric layer. An additional layer can be located over the interdigital transducer electrode. The acoustic wave filter component can also include a bulk acoustic wave resonator supported by the additional layer. The acoustic wave device can be a boundary wave resonator, and one or more boundary wave resonators may be provided in a stacked arrangement, with the bulk acoustic wave resonator in the top layer of the stacked arrangement. The acoustic wave device can also be a temperature-compensated surface acoustic wave device.

19 Claims, 20 Drawing Sheets

Related U.S. Application Data filed on Nov. 21, 2019, provisional application No. 62/938,539, filed on Nov. 21, 2019.

(51) Int. Cl.
| | |
|---|---|
| *H03H 9/13* | (2006.01) |
| *H03H 9/145* | (2006.01) |
| *H03H 9/17* | (2006.01) |
| *H03H 9/25* | (2006.01) |
| *H03H 9/64* | (2006.01) |
| *H03H 9/72* | (2006.01) |
| *H04B 1/38* | (2015.01) |

(52) U.S. Cl.
CPC .... *H03H 9/02228* (2013.01); *H03H 9/02834* (2013.01); *H03H 9/105* (2013.01); *H03H 9/132* (2013.01); *H03H 9/145* (2013.01); *H03H 9/173* (2013.01); *H03H 9/175* (2013.01); *H03H 9/25* (2013.01); *H03H 9/6406* (2013.01); *H03H 9/6443* (2013.01); *H03H 9/6483* (2013.01); *H03H 9/725* (2013.01); *H04B 1/38* (2013.01)

(58) Field of Classification Search
CPC ........ H03H 9/105; H03H 9/132; H03H 9/145; H03H 9/173; H03H 9/175; H03H 9/25; H03H 9/6406; H03H 9/6443; H03H 9/6483; H03H 9/725; H03H 9/0222; H03H 9/1014; H03H 9/605; H03H 2003/0071; H03H 9/0561; H04B 1/38
USPC .......................... 333/133, 187, 188, 193–196
See application file for complete search history.

(56) References Cited

U.S. PATENT DOCUMENTS

| | | | |
|---|---|---|---|
| 9,628,048 | B2 | 4/2017 | Nam et al. |
| 10,090,825 | B2 | 10/2018 | Kuroyanagi |
| 11,671,072 | B2 | 6/2023 | Goto et al. |
| 11,923,822 | B2 | 3/2024 | Maki et al. |
| 2004/0222717 | A1* | 11/2004 | Matsuda ............ H03H 9/02866 310/313 R |
| 2014/0203893 | A1* | 7/2014 | Kando ............... H03H 9/02574 333/187 |
| 2014/0339956 | A1 | 11/2014 | Kanae |
| 2014/0368084 | A1 | 12/2014 | Fukano et al. |
| 2015/0171823 | A1 | 6/2015 | Brawley |
| 2017/0077900 | A1 | 3/2017 | Park et al. |
| 2018/0191328 | A1 | 7/2018 | Lee et al. |
| 2018/0205360 | A1 | 7/2018 | Han et al. |
| 2020/0106416 | A1* | 4/2020 | Iwamoto ............. H03H 9/0576 |
| 2021/0203305 | A1 | 7/2021 | Maki et al. |
| 2021/0250012 | A1 | 8/2021 | Hou et al. |
| 2021/0281246 | A1 | 9/2021 | Maki et al. |
| 2022/0368311 | A1 | 11/2022 | Shin et al. |

OTHER PUBLICATIONS

U.S. Appl. No. 16/951,498, filed Nov. 18, 2020, Bulk Acoustic Wave Resonator On Surface Acoustic Wave Device.

U.S. Appl. No. 16/951,545, filed Nov. 18, 2020, Packaged Bulk Acoustic Wave Resonator On Acoustic Wave Device.

* cited by examiner

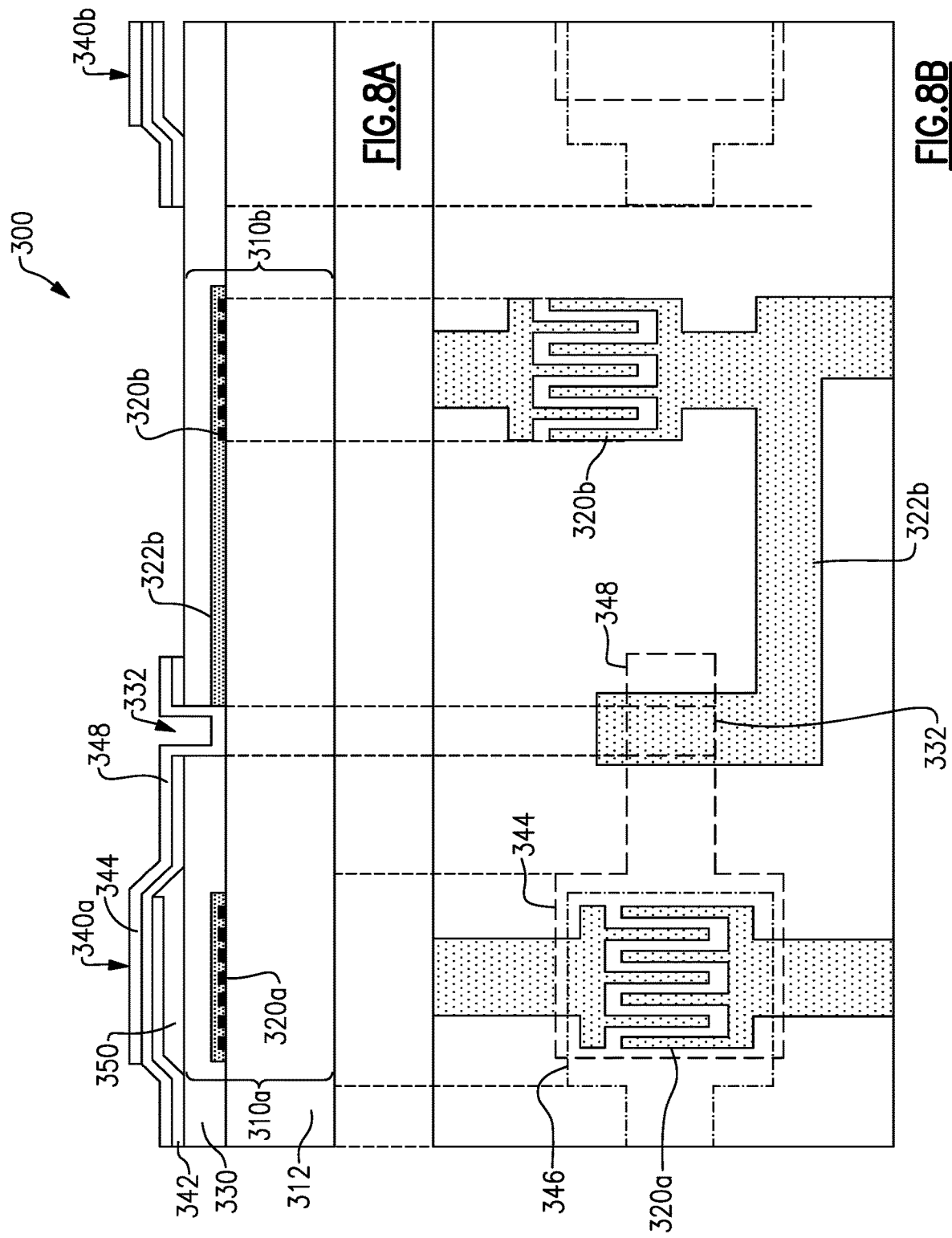

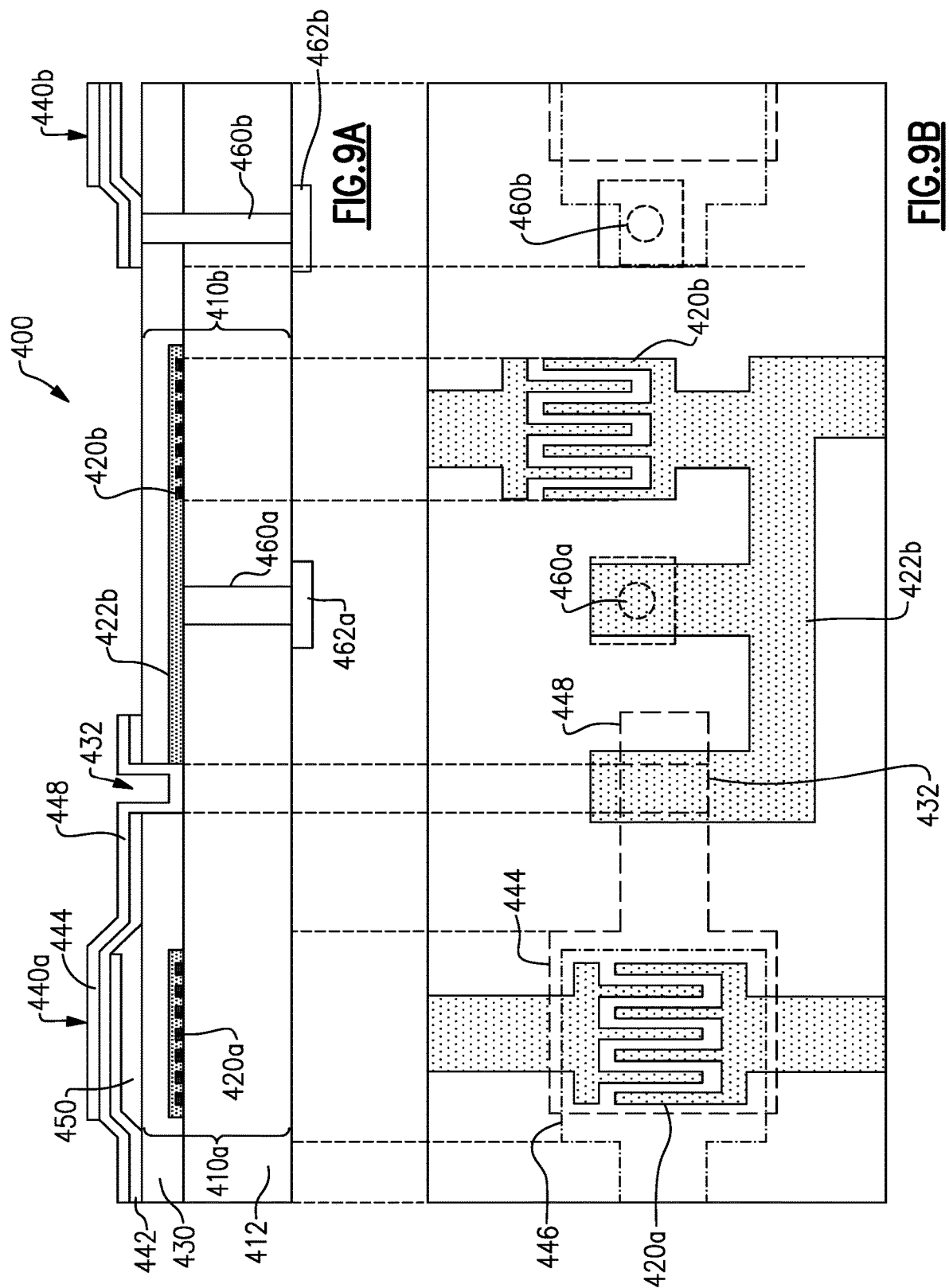

BULK ACOUSTIC WAVE RESONATOR ON MULTI-LAYER PIEZOELECTRIC SUBSTRATE ACOUSTIC WAVE DEVICE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 62/938,544, filed Nov. 21, 2019, titled "BULK ACOUSTIC WAVE RESONATOR ON SURFACE ACOUSTIC WAVE DEVICE," U.S. Provisional Patent Application No. 62/938,556, filed Nov. 21, 2019, titled "BULK ACOUSTIC WAVE RESONATOR ON MULTI-LAYER PIEZOELECTRIC SUBSTRATE ACOUSTIC WAVE DEVICE," and U.S. Provisional Patent Application No. 62/938,539, filed Nov. 21, 2019, titled "PACKAGED BULK ACOUSTIC WAVE RESONATOR ON ACOUSTIC WAVE DEVICE," are hereby incorporated by reference under 37 CFR 1.57 in their entirety.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave filter component is disclosed. The acoustic wave filter component can include a surface acoustic wave device that includes a first piezoelectric layer, an interdigital transducer electrode on the first piezoelectric layer, and at least a portion of a temperature compensation layer positioned on the interdigital transducer electrode. The acoustic wave filter component can also include a bulk acoustic wave resonator that is supported by the temperature compensation layer. The bulk acoustic wave resonator includes a second piezoelectric layer and electrodes on opposing sides of the second piezoelectric layer.

In one embodiment, the bulk acoustic wave resonator includes an air cavity having a shape that is impacted by the temperature compensation layer.

In one embodiment, the bulk acoustic wave resonator includes an air cavity in physical contact with the temperature compensation layer. The air cavity can be in contact with a portion of an underlying layer along which a surface acoustic wave propagates. The air cavity can be shared with the interdigital transducer electrode of the surface acoustic wave device.

In one embodiment, the bulk acoustic wave resonator is in contact with a portion of an underlying layer along which a surface acoustic wave propagates.

In one embodiment, the bulk acoustic wave resonator includes a solid acoustic mirror on the temperature compensation layer. The solid acoustic mirror can be in physical contact with the temperature compensation layer. The bulk acoustic wave resonator can be laterally offset from the interdigital transducer electrode of the surface acoustic wave device.

In one embodiment, the acoustic wave filter component further includes a support substrate. The first piezoelectric layer can be positioned on the support substrate.

In one embodiment, the surface acoustic wave device and the bulk acoustic wave device are included in a single filter arranged to filter a radio frequency signal.

In one embodiment, the surface acoustic wave device and the bulk acoustic wave device are included in separate filters arranged to filter radio frequency signals.

In one embodiment, the bulk acoustic wave device is included in a filter arranged to filter a radio frequency signal. The surface acoustic wave device can be included in a cancellation circuit coupled to the filter.

In one embodiment, the surface acoustic wave device is a surface acoustic wave resonator.

In one embodiment, the bulk acoustic wave resonator is a film bulk acoustic wave resonator.

In one embodiment, at least one of the electrodes of the bulk acoustic wave resonator component extends over at least a portion of the interdigital transducer electrode.

In one embodiment, the acoustic wave filter component further includes an internal via extending through the temperature compensation layer. The bulk acoustic wave resonator can be in electrical communication with the surface acoustic wave device by way of the internal via extending through the temperature compensation layer. The internal via can include a conformal layer of conductive material over an aperture in the temperature compensation layer. The internal via can include a conductive material filling an aperture in the temperature compensation layer. The internal via can be in electrical communication with a bulk acoustic wave resonator interconnect electrode extending between the internal via and one of the electrodes of the bulk acoustic wave resonator.

In one embodiment, the acoustic wave filter component further includes an air cavity between a portion of the bulk acoustic wave resonator and the temperature compensation layer. The air cavity can extend between a portion of the bulk acoustic wave resonator and a portion of the surface acoustic wave device.

In one embodiment, the acoustic wave filter component further includes a first external via extending through the first piezoelectric layer. The first external via can be in electrical communication with the surface acoustic wave device. The first external via can be in electrical communication with a connection pad located on a side of the piezoelectric layer opposite the first interdigital transducer electrode.

In one embodiment, the acoustic wave filter component further includes a second external via extending through the first piezoelectric layer and through the temperature compensation layer. The second external via can be in electrical communication with the bulk acoustic wave resonator. The second external via can include a first via section extending through the first piezoelectric layer and a second via section extending through the temperature compensation layer. The first via section can be in contact with the second via section. The first via section can be offset from the second via section. The second external via can additionally include a via interconnect structure extending between the first via section and the second via section. The second via section can include a conformal layer of conductive material formed over an aperture in the temperature compensation layer.

In one aspect, an acoustic wave filter is disclosed. The acoustic wave filter can include a first piezoelectric layer, an interdigital transducer electrode positioned over the first piezoelectric layer, a temperature compensation layer positioned over the interdigital transducer electrode, and a bulk acoustic wave resonator that is supported by the temperature compensation layer. The bulk acoustic wave resonator includes a second piezoelectric layer and electrodes on opposing sides of the second piezoelectric layer.

In one embodiment, at least one of the electrodes of the bulk acoustic wave resonator component extends over at least a portion of the interdigital transducer electrode.

In one embodiment, the bulk acoustic wave resonator is electrically connected to the interdigital transducer electrode by way of an internal via extending through the temperature compensation layer.

In one embodiment, the acoustic wave filter component further includes a second interdigital transducer electrode over the first piezoelectric layer. The bulk acoustic wave resonator can be electrically connected to the interdigital transducer electrode by way of an internal via extending through the temperature compensation layer.

In one embodiment, the acoustic wave filter component further includes an external via in electrical communication with the bulk acoustic wave resonator. The external via can extend through the first piezoelectric layer and the temperature compensation layer. The external via can include a first via section extending through the temperature compensation layer and a second via section extending through the first piezoelectric layer. The first via section can be in contact with the second via section. The first via section can be offset from the second via section. The second external via can additionally include a via interconnect structure extending between the first via section and the second via section. The first via section can include a conformal layer of conductive material formed over an aperture in the temperature compensation layer.

In one embodiment, the acoustic wave filter component further includes a second bulk acoustic wave resonator supported by the temperature compensation layer.

In one embodiment, the first piezoelectric layer is a portion of a multi-layer piezoelectric substrate. The multi-layer piezoelectric substrate can also include a support substrate located on an opposite side of the first piezoelectric layer as the surface acoustic wave interdigital transducer electrode.

In one aspect, an acoustic wave filter is disclosed. The acoustic wave filter can include a multi-layer piezoelectric substrate acoustic wave device that includes a support substrate, a first piezoelectric layer on the support substrate, and an interdigital transducer electrode on the first piezoelectric layer. The acoustic wave filter can also include a bulk acoustic wave resonator supported by a layer positioned over the interdigital transducer electrode. The bulk acoustic wave resonator includes a second piezoelectric layer and electrodes on opposing sides of the second piezoelectric layer.

In one embodiment, the multi-layer piezoelectric substrate acoustic wave device is a multi-layer piezoelectric substrate surface acoustic wave device. The layer over the interdigital transducer electrode can be a temperature compensation layer. The bulk acoustic wave resonator can be in contact with a portion of an underlying layer along which a surface acoustic wave propagates. The bulk acoustic wave resonator can include an air cavity in physical contact with the underlying layer. The multi-layer piezoelectric substrate acoustic wave device can be a boundary wave resonator. The layer over the interdigital transducer electrode can be a second support substrate. The acoustic wave filter component can further include a temperature compensation layer located between the interdigital transducer electrode and the second support substrate.

In one aspect, an acoustic wave filter component is disclosed. The acoustic wave filter component can include a boundary wave resonator that is supported by a first portion of a first support substrate. The boundary wave resonator includes a first piezoelectric layer and an interdigital transducer electrode on the first piezoelectric layer. The acoustic wave filter component can also include a bulk acoustic wave resonator that is supported by a second support substrate. The second support substrate is positioned over the boundary wave resonator. The bulk acoustic wave resonator is located on an opposite side of the second support substrate as the interdigital transducer electrode of the boundary wave resonator.

In one embodiment, the boundary wave resonator further includes a low velocity layer located between the first piezoelectric layer and the second support layer. The interdigital transducer electrode can be located between the first piezoelectric layer and the low velocity layer.

In one embodiment, the acoustic wave filter component further includes an air gap located between a portion of the boundary wave resonator and the second support substrate.

In one embodiment, the acoustic wave filter component further includes an internal via extending through the second support substrate. The bulk acoustic wave resonator can be in electrical communication with the boundary wave resonator by way of the internal via extending through the second support substrate. The boundary wave resonator can also include a boundary wave interconnect electrode that is in electrical communication with the interdigital transducer electrode. The internal via can be in contact with the boundary wave interconnect electrode.

In one embodiment, the acoustic wave filter component further include an external via extending through the first support substrate and in electrical communication with the boundary wave resonator. The external via can be in electrical communication with an external connection pad on the opposite side of the acoustic wave filter component as the boundary wave resonator.

In one embodiment, the acoustic wave filter component further includes a second external via extending through the first and second support substrates and in electrical communication with the bulk acoustic wave resonator.

In one embodiment, the acoustic wave filter component further includes a third support substrate located on the opposite side of the first support substrate as the second support substrate, and a second boundary wave resonator. The second boundary wave resonator can include a second piezoelectric layer and a second interdigital transducer electrode on the second piezoelectric layer. The acoustic wave filter component can further include an internal via extending through the first support substrate. The first boundary wave resonator can be in electrical communication with the second boundary wave resonator by way of the internal via extending through the first support substrate. The acoustic wave filter component can further include an internal via extending through the first and second support substrates. The second boundary wave resonator can be in electrical communication with the bulk acoustic wave resonator by way of the internal via extending through the first and second support substrates. The acoustic wave filter component can further include an external via extending through the third support substrate and in electrical communication with the second boundary wave resonator.

In one aspect, an acoustic wave filter component is disclosed. The acoustic wave filter component can include a first boundary wave resonator that is supported by a first support substrate. The first boundary wave resonator includes a first interdigital transducer electrode. The first interdigital transducer electrode is located adjacent a first piezoelectric layer. The acoustic wave filter component can also include a second boundary wave resonator that is separated from the first boundary wave resonator by a second support substrate. The second boundary wave resonator includes a second interdigital transducer electrode. The second interdigital transducer electrode is located adjacent a second piezoelectric layer. The acoustic wave filter component can further include a bulk acoustic wave resonator that is separated from the second boundary wave resonator by a third support substrate. The bulk acoustic wave resonator includes a third piezoelectric layer, and first and second electrodes on opposing sides of the third piezoelectric layer.

In one embodiment, the first boundary wave resonator further includes a first high velocity layer located between the first piezoelectric layer and the first support substrate, a second high velocity layer located between the first piezoelectric layer and the second support substrate, and a low velocity layer located between the first piezoelectric layer and the second high velocity layer. The second boundary wave resonator can further include a third high velocity layer located between the second piezoelectric layer and the second support substrate, a fourth high velocity layer located between the second piezoelectric layer and the third support substrate, and a second low velocity layer located between the second piezoelectric layer and the fourth high velocity layer.

In one embodiment, the acoustic wave filter component further includes an external via in electrical communication with the bulk acoustic wave resonator. The external via can extend through the first, second, and third support substrates. The external via can be electrically connected to the first electrode of the bulk acoustic wave resonator. The external via can be electrically connected to the second electrode of the bulk acoustic wave resonator.

In one embodiment, the acoustic wave filter component further includes an internal via that is in electrical communication with the bulk acoustic wave resonator and the first boundary wave resonator. The internal via extends through the second and third support substrates.

In one embodiment, the acoustic wave filter component further includes an internal via in electrical communication with the bulk acoustic wave resonator and the second boundary wave resonator, the internal via extending through the third support substrate.

In one aspect, a packaged hybrid filter component is disclosed. The packaged hybrid component can include an acoustic wave device that includes a piezoelectric layer and an interdigital transducer electrode on the piezoelectric layer. the packaged hybrid component can also include a support layer located over the interdigital transducer electrode, and a bulk acoustic wave resonator supported by the support layer. The bulk acoustic wave resonator is included in an acoustic wave filter that is arranged to filter a radio frequency signal. The packaged hybrid component can further include a cap layer that encapsulates the bulk acoustic wave resonator, and an external via that is in electrical communication with the bulk acoustic wave resonator. The external via extends through the support layer and the piezoelectric layer.

In one embodiment, the acoustic wave device is included in the acoustic wave filter.

In one embodiment, the acoustic wave device is included in a second acoustic wave filter.

In one embodiment, the acoustic wave device is included in a cancellation circuit coupled to the filter.

In one embodiment, the packaged hybrid filter component further includes an external connection pad in electrical communication with the external via. The external connection pad can be supported by a side of the piezoelectric layer opposite the side of the piezoelectric layer on which the interdigital transducer electrode is located. The external connection pad can serve as an input contact or an output contact of the packaged hybrid filter. The packaged hybrid filter component can further includes a support substrate. The piezoelectric layer can be located between the support substrate and the interdigital transducer electrode. The external connection pad can be supported by a side of the support substrate opposite the side of the support substrate on which the piezoelectric layer is located. The packaged hybrid filter component can further include a functional layer located between the piezoelectric layer and the support substrate.

In one embodiment, the packaged hybrid filter component further includes an internal via extending through the support layer. The internal via can be in electrical communication with the bulk acoustic wave resonator and the interdigital transducer electrode. The internal via can be electrically connected to a bulk acoustic wave interconnect electrode supported by the support layer and extending between the bulk acoustic wave resonator and the internal via. The internal via can be electrically connected to an acoustic wave interconnect electrode supported by the piezoelectric layer and extending between the interdigital transducer electrode and the internal via. The internal via can include a conformal layer of conductive material formed over an aperture in the support layer. The internal via can include a conductive material filling an aperture in the support layer.

In one embodiment, the acoustic wave resonator is a surface acoustic wave resonator. The support layer can include a temperature compensation layer. The packaged hybrid filter component further includes a second acoustic wave resonator. The second acoustic wave resonator can include a second interdigital transducer electrode supported by the piezoelectric layer. The acoustic wave resonator can be connected in series with the second acoustic wave resonator and the bulk acoustic wave resonator. The surface acoustic wave resonator can be capacitively coupled to the bulk acoustic wave resonator.

In one embodiment, the acoustic wave resonator is a boundary wave resonator.

In one embodiment, the packaged hybrid filter further includes a second support substrate. The piezoelectric layer can be located between the second support substrate and the interdigital transducer electrode.

In one embodiment, the acoustic wave resonator is a multi-mode surface acoustic wave filter. The support layer can include a temperature compensation layer. The bulk acoustic wave resonator can be one of a plurality of bulk acoustic wave resonators supported by the support layer and connected in a ladder topology.

In one aspect, a packaged hybrid filter component is disclosed. The packaged hybrid filter component can include a surface acoustic wave device that includes a piezoelectric layer and an interdigital transducer electrode on the piezoelectric layer. The packaged hybrid filter component can also include an additional layer located over the interdigital transducer electrode. The additional layer is configured such that a surface acoustic wave of the surface acoustic wave device propagates along the additional layer. The packaged hybrid filter component can also include a bulk acoustic wave resonator that is supported by the additional layer. The bulk acoustic wave resonator can be included in an acoustic wave filter arranged to filter a radio frequency signal. The packaged hybrid filter component can further include a cap layer that encapsulates the bulk acoustic wave resonator, and an external via that is in electrical communication with the bulk acoustic wave resonator. The external via extends through the support layer and the piezoelectric layer.

In one embodiment, the bulk acoustic wave resonator includes an air cavity having a shape that is impacted by the additional layer.

In one embodiment, the bulk acoustic wave resonator includes an air cavity in physical contact with the additional layer. The air cavity can be shared with the interdigital transducer electrode of the surface acoustic wave device.

In one embodiment, the bulk acoustic wave resonator is in contact with a portion of the additional layer.

In one embodiment, the bulk acoustic wave resonator includes a solid acoustic mirror on the additional layer. The solid acoustic mirror can be in physical contact with the additional layer. The bulk acoustic wave resonator can be laterally offset from the interdigital transducer electrode of the surface acoustic wave device.

In one embodiment, the additional layer includes a temperature compensation layer.

The present disclosure relates to U.S. Patent Application Ser. No. 16/951,483, titled "BULK ACOUSTIC WAVE RESONATOR ON MULTI-LAYER PIEZOELECTRIC SUBSTRATE ACOUSTIC WAVE DEVICE," filed on Nov. 18, 2020, the entire disclosure of which is hereby incorporated by reference herein. The present disclosure relates to U.S. Patent Application Ser. No. 16/951,545, titled "PACKAGED BULK ACOUSTIC WAVE RESONATOR ON ACOUSTIC WAVE DEVICE," filed on Nov. 18, 2020, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 8A illustrates a cross-section of an embodiment of an acoustic wave filter component that includes a piezoelectric wafer supporting a plurality of SAW devices and a plurality of BAW resonators arranged in a stacked orientation.

FIG. 8B illustrates a top plan view of the acoustic wave filter component of FIG. 8A.

FIG. 9A illustrates a cross-section of another embodiment of an acoustic wave filter component that includes a piezoelectric wafer supporting a plurality of SAW devices and a plurality of BAW resonators arranged in a stacked orientation illustrating conductive vias extending through the piezoelectric wafer and in electrical communication with a SAW device and a BAW resonator.

FIG. 9B illustrates a top plan view of the acoustic wave filter component of FIG. 9A.

DETAILED DESCRIPTION OF CERTAIN EMBODIMENTS

Figure 1A:
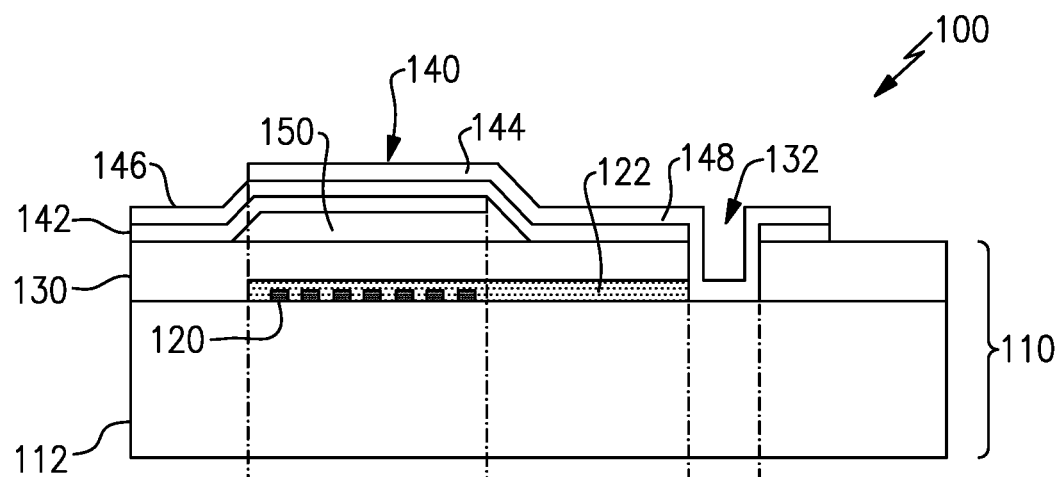
FIG. 1A illustrates a cross-section of an embodiment of an acoustic wave filter component including a piezoelectric wafer supporting a surface acoustic wave (SAW) device and a bulk acoustic wave (BAW) resonator arranged in a stacked orientation.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With reduced module sizes and specifications for better performance, it is becoming increasingly difficult to achieve desirable filter performance and be cost effective while reducing the size of filters. By forming a stacked arrangement of acoustic wave devices, the footprint of an acoustic wave filter component including a plurality of acoustic wave devices can be reduced. Interconnections may be made between some or all of the various components of the stacked devices, to connect the stacked acoustic wave devices in a desired arrangement.

Aspects of this disclosure relate to the arrangement of one or more bulk acoustic wave (BAW) resonators positioned in a stacked arrangement over one or more acoustic wave devices of another type, such as surface acoustic wave (SAW) devices. By providing a hybrid acoustic wave filter component, rather than a first die including BAW resonators and a second die including SAW devices, the overall size of the hybrid acoustic wave filter component can be reduced. Because the devices can be stacked in multiple layers, interconnection structures in one or more of the multiple layers can be used, in conjunction with internal and external conductive vias, to provide internal interconnection between resonators and external interconnection with the devices.

A BAW resonator membrane can be built on a silicon dioxide layer. In an embodiment, a BAW resonator membrane can be built on the silicon dioxide layer of a SAW resonator that is positioned over the interdigital transducer (IDT) electrode of the SAW resonator. Acoustic interaction can be reduced and/or eliminated by positioning the in the IDT of the SAW resonator below the membrane of the BAW resonator or outside a footprint of the membrane of the BAW resonator. An air cavity can be shared by the SAW resonator and a membrane of the BAW resonator. In certain applications, the BAW resonator and the SAW resonator can be electrically connected to each other by way of a conductive via extending through the silicon dioxide layer. Embodiments disclosed herein can provide a small sized SAW/BAW hybrid die. A SAW and BAW mixed structure according to one or more embodiments can provide more design freedom that previous designs.

FIG. 1A illustrates a cross-section of an embodiment of an acoustic wave filter component including a piezoelectric wafer supporting a surface acoustic wave (SAW) device and a bulk acoustic wave (BAW) resonator arranged in a stacked orientation. The SAW device can be a SAW resonator, a SAW delay element, or part of a multi-mode SAW filter. The stacked device structure 100 of FIG. 1A includes a piezoelectric layer 112. In some embodiments, the piezoelectric layer 112 may include a material such as lithium tantalate (LT) or lithium niobate (LN), although other suitable materials may also be used. In some embodiments, one or more additional layers, not shown in FIG. 1A, may be included, such as a support layer underlying the piezoelectric layer 112 or a support layer and a functional layer located between the support layer and the piezoelectric layer.

The stacked device structure 100 also includes an interdigital transducer (IDT) electrode 120 overlying the piezoelectric layer 112. The IDT electrode 120 can include any suitable IDT electrode material. In the illustrated embodiment, the IDT electrode 120 includes a single layer, although other embodiments of IDT electrodes can include multiple sublayers. In some embodiments, the IDT electrode 120 can include a layer of Aluminum (Al) copper (Cu), Magnesium (Mg), tungsten (W), titanium (Ti), or other suitable materials, as well as any suitable combination thereof. In some embodiments, the IDT electrode 120 may include alloys, such as AlMgCu, AlCu, etc. In addition, a SAW interconnect electrode 122 is visible in the cross-section of FIG. 1A, which may be in electrical communication with the IDT electrode 120. The illustrated SAW interconnect electrode 122 is thicker that the IDT electrode 120.

A temperature compensation layer 130 is located over the IDT electrode 120. In some embodiments, the temperature compensation layer 130 may include a layer of silicon dioxide (SiO2) or other silica oxide-based material, although other suitable materials may also be used. The combination of the piezoelectric layer 112, the IDT electrode 120, and the overlying portion of the temperature compensation layer 130 form a temperature-compensated surface acoustic wave (SAW) resonator 110. In the SAW resonator 110, the temperature compensation layer 130 can bring a temperature coefficient of frequency (TCF) of the SAW resonator 110 closer to zero. The temperature compensation layer 130 can have a positive TCF. This can compensate for a negative TCF of the piezoelectric layer 112, as various piezoelectric layers such as lithium niobate and lithium tantalate have a negative TCF.

The stacked device structure 100 also includes a bulk acoustic wave (BAW) resonator 140 supported by the temperature compensation layer 130 of the SAW resonator 110. In the illustrated embodiment, the BAW resonator 140 is a film bulk acoustic wave resonator (FBAR). The BAW resonator 140 is partially spaced apart from the underlying temperature compensation layer 130 by an air gap or cavity 150. The air cavity 150 can be shared by the IDT electrode 120 of the SAW resonator 110 and a membrane of the BAW resonator 140. The air cavity 150 can be in contact with a portion of an underlying layer along which a surface acoustic wave of the SAW resonator 110 propagates. As illustrated, the air cavity 150 has a shape that is impacted by the temperature compensation layer 130. In FIG. 1A, the air cavity 150 is in physical contact with the temperature compensation layer 130. However, the shape of the air cavity 150 can be impacted by the temperature compensation layer 130 even if there are one or more intervening layers between the temperature compensation layer 130 and the air cavity 150. The air cavity 150 may be formed, for example, by depositing or otherwise forming a sacrificial layer or layers in a desired shape prior to the formation of overlying layers of the BAW resonator 140, and subsequently removing the sacrificial layer or layers at a later stage of the fabrication process. Alternatively, an air cavity can be etched into an underlying layer in certain instances (not illustrated in FIG. 1A).

In some other embodiments, a BAW resonator may be a solidly mounted resonator without such a cavity 150. Such a BAW resonator can include a solid acoustic mirror positioned over the temperature compensation layer 130. The solid acoustic mirror can include an acoustic Bragg reflector. The acoustic Bragg reflector can include alternating high impedance and low impedance layers (e.g., tungsten high impedance layers and silicon dioxide low impedance layers, or molybdenum high impedance layers and silicon dioxide low impedance layers). A solid acoustic mirror may be used in place of or in addition to one or more cavities in accordance with any suitable principles and advantages disclosed herein. The embodiments described herein may be suitable for use with BAW resonators of any suitable type or design, and any suitable combination of such resonators.

The BAW resonator 140 includes a lower electrode 142 and an upper electrode 144, separated from one another by a piezoelectric layer 146. The piezoelectric layer 146 can be an aluminum nitride (AlN) layer or any other suitable piezoelectric layer. Portions of the piezoelectric layer 146 and the lower and upper electrodes 142 and 144 extend over the cavity 150. At least a portion of the upper electrode 144 can be patterned to adjust the operational frequency of the BAW resonator 140.

An active region or active domain of a bulk acoustic wave resonator 140 can be defined by the portion of the piezoelectric layer 146 that overlaps with both the upper electrode 144 and the lower electrode 142 over the cavity 150. The portions of these layers within the active region of the BAW resonator 140 may be substantially parallel to the underlying surface of the temperature compensation layer 130 in some embodiments.

Although not illustrated, a BAW resonator in accordance with any suitable principles and advantages disclosed herein can include a raised frame structure and/or a recessed frame structure.

One or more additional layers not explicitly illustrated in FIG. 1A may also be included, such as passivation layers. A passivation layer may be provided, for example, between a sacrificial layer and the other layers of the BAW resonator 140 to protect those layers from the fabrication steps used in the removal of the sacrificial layer to form the cavity 150. Such a passivation layer can be present in a bulk acoustic wave device after removal of the sacrificial material. Similarly, a passivation layer may be provided over the upper surfaces of the layers of the BAW resonator 140. A passivation layer may also be provided above the temperature compensation layer 130 and below the cavity 150 and the BAW resonator 140.

The SAW resonator 110 and the BAW resonator 140 may be electrically connected to one another, and/or to other resonators within or supported by the stacked device structure 100, by way of any suitable conductive structure. In some embodiments, connections between device may include interconnect traces and/or other structures formed on the same side of the various layers of the stacked device structure 100 as the device. In some embodiments, connections between device, and/or to external components, may include conductive vias extending into and/or through layers of the stacked device structure 100.

In the illustrated embodiment, a conductive via 132 extending through the temperature compensation layer 130 forms part of an electrical connection between the SAW resonator 110 and the BAW resonator 140. A BAW interconnect electrode 148 extending from the upper electrode 144 of the BAW resonator 140 connects the upper electrode 144 of the BAW resonator 140 with the conductive via 132. The conductive via 132 is in electrical communication with the underlying SAW interconnect electrode 122. In the illustrated embodiment, the conductive via 132 is a conductive structure extending through the temperature compensation layer 130 between the BAW interconnect electrode 148 and the SAW interconnect electrode 122.

In some embodiments, the BAW interconnect electrode 148 and the conductive via 132 may be formed simultaneously as a single contiguous structure. This structure may, as in the illustrated embodiment, be conformal over a patterned region of the temperature compensation layer 130 through which an aperture has been formed at the location of the via 132.

Figure 1B:
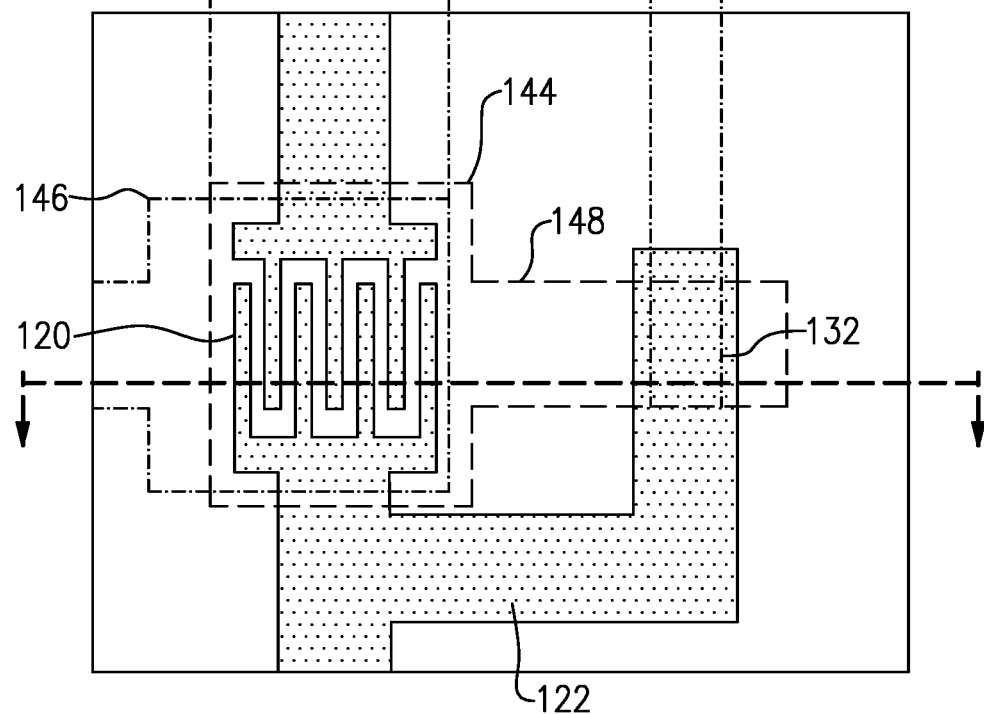
FIG. 1B illustrates a top plan view of the stacked arrangement of the acoustic wave filter component of FIG. 1A.

FIG. 1B illustrates a top plan view of the stacked arrangement of the acoustic wave filter component of FIG. 1A. It can be seen that the active area of the BAW resonator 140 (see FIG. 1A), in which the upper electrode 144 of the BAW resonator 140 overlaps with the lower electrode 142 of the BAW resonator 140, overlaps at least a portion of the IDT electrode 120. The conductive via 132 is located in a region in which the BAW interconnect electrode 148 overlaps the SAW interconnect electrode 122.

Figure 2:
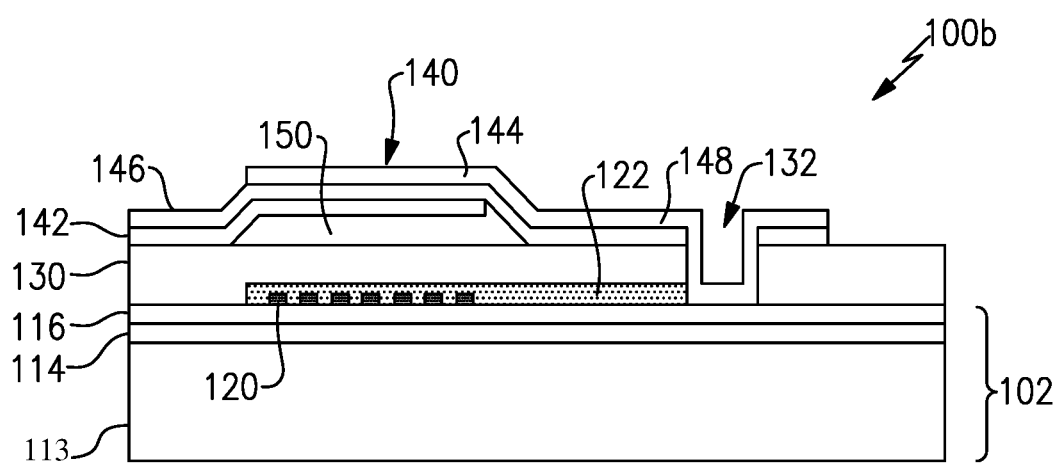
FIG. 2 illustrates a cross-section of an embodiment of an acoustic wave filter component including a piezoelectric wafer supporting a surface acoustic wave (SAW) device and a bulk acoustic wave (BAW) resonator arranged in a stacked orientation and supported by a multilayer piezoelectric substrate.

FIG. 2 illustrates a cross-section of an embodiment of an acoustic wave filter component including a piezoelectric wafer supporting a surface acoustic wave (SAW) device and a bulk acoustic wave (BAW) resonator supported by a multilayer piezoelectric substrate. The stacked device structure 100b of FIG. 2 is similar to the stacked device structure 100 of FIG. 1A except that the stacked device structure 100b of FIG. 2 includes a multi-layer piezoelectric substrate 102. The multi-layer piezoelectric substrate 102 includes a piezoelectric layer 116 supported by support substrate 113, and a functional layer 114 between the piezoelectric layer 116 and the support substrate 113.

Figure 3A:
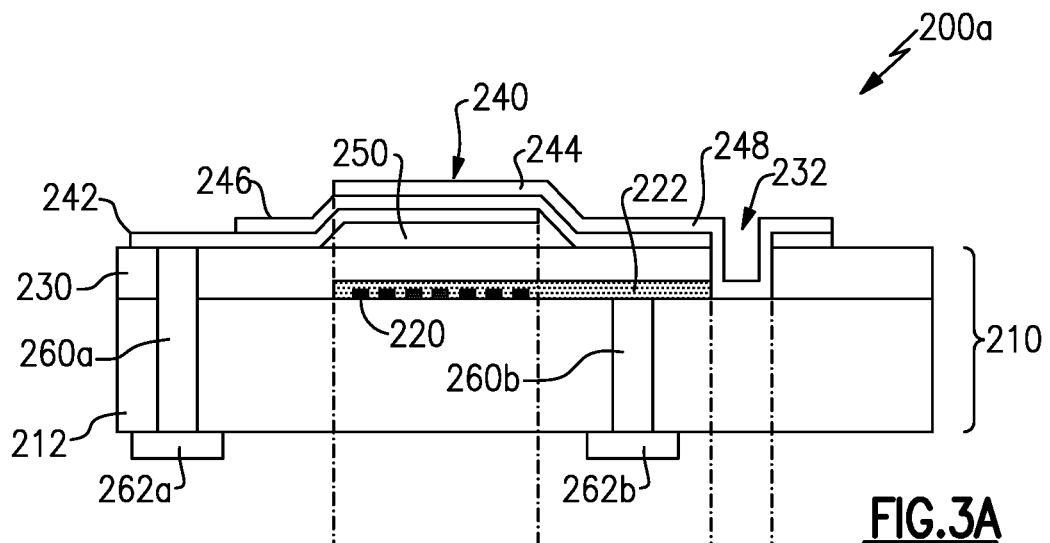
FIG. 3A illustrates a cross-section of another embodiment of an acoustic wave filter component including a piezoelectric wafer supporting a SAW device and a BAW resonator arranged in a stacked configuration, illustrating conductive vias extending through the piezoelectric wafer and in electrical communication with each of the SAW device and the BAW resonator.

FIG. 3A illustrates a cross-section of another embodiment of an acoustic wave filter component including a piezoelectric wafer supporting a SAW device and a BAW resonator arranged in a stacked configuration, illustrating conductive vias extending through the piezoelectric wafer and in electrical communication with each of the SAW device and the BAW resonator.

The stacked device structure 200a of FIG. 3A is similar to the stacked device structure 100 of FIG. 1A, except that each of the SAW device 210 and the BAW resonator 240 are also in contact with one of conductive vias 260a and 260b which extend through the piezoelectric layer 212. In the illustrated embodiment, the lower electrode 242 of the BAW resonator 240 is electrically connected to a conductive via 260a. The conductive via 260a extends through both the temperature compensation layer 230 and the piezoelectric layer 212. In this illustrated embodiment, the conductive via 260a may terminate in and/or be electrically connected to an external connection pad 262a.

The stacked device structure 200a also includes a conductive via 260b, which is electrically connected to the IDT electrode 220 by way of the SAW interconnect electrode 222. Unlike the conductive via 260a, which extends through both the temperature compensation layer 230 and the piezoelectric layer 212, the conductive via 260b extends only through the piezoelectric layer 212. In the illustrated embodiment, the conductive via 260b may terminate in and/or be electrically connected to an external connection pad 262b. The external connection pads 262a and 262b may allow, for example, a connection to be made with a BAW resonator 240 and a SAW device 210, respectively, after the BAW resonator 240 and the SAW device 210 have been packaged, for example, as discussed with respect to FIG. 5.

Figure 3B:
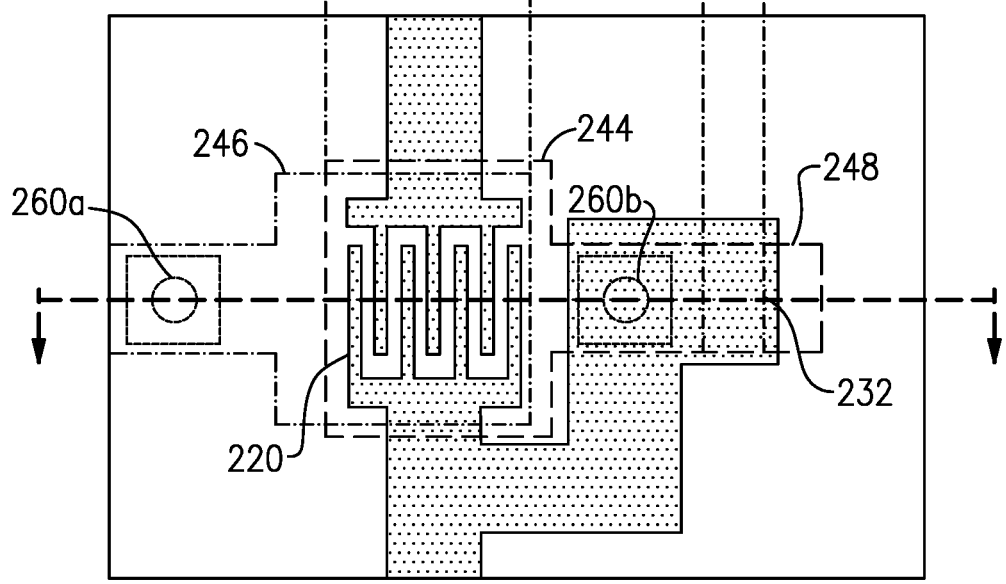
FIG. 3B illustrates a top plan view of the acoustic wave filter component of FIG. 3A.

FIG. 3B illustrates a top plan view of the acoustic wave filter component of FIG. 3A. It can be seen in FIG. 3B that the shape of the SAW interconnect electrode 222 differs from the shape of the SAW interconnect electrode 122 illustrated in FIG. 1A. In the illustrated embodiment, the conductive vias 260a, 260b, and 232 are aligned with one another, such that they are all visible in the cross-sectional view of FIG. 3A. However, in some other embodiments, the vias need not be aligned with one another, and may be positioned at any suitable location. Furthermore, the design of either or both of the SAW interconnect electrode 222 and the BAW interconnect electrode 238 may be altered to accommodate desired via locations.

Figure 4:
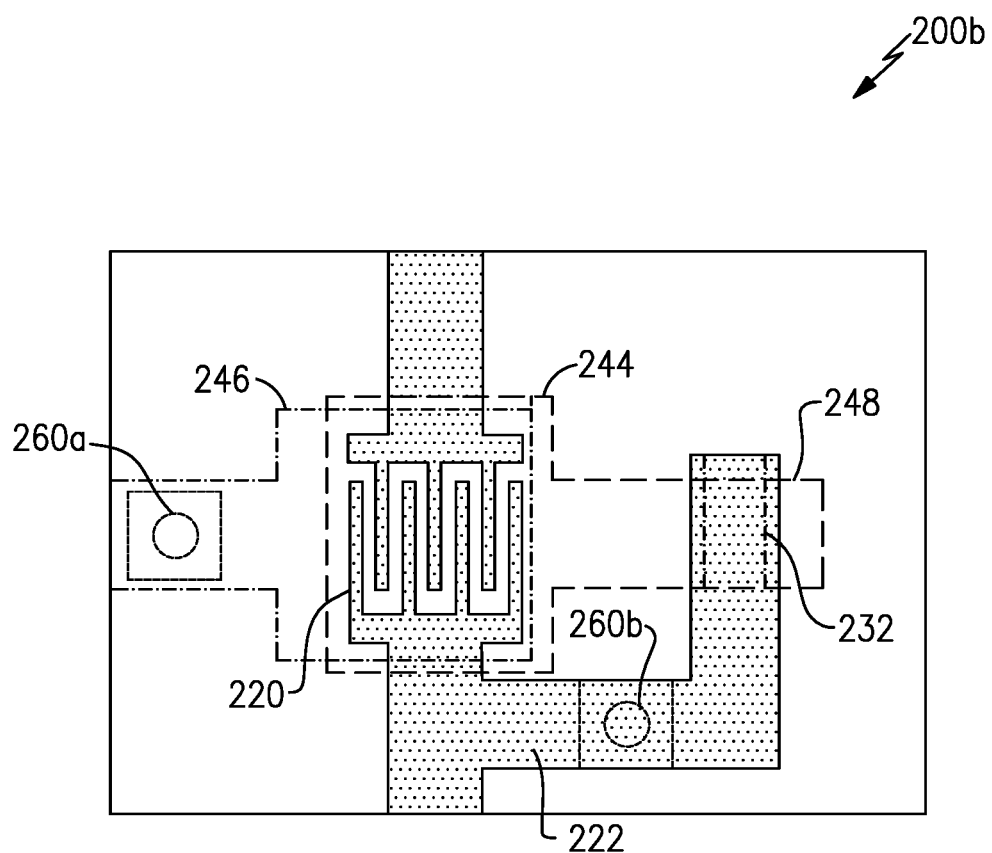
FIG. 4 illustrates a top plan view of another embodiment of an acoustic wave filter component.

FIG. 4 illustrates a top plan view of another embodiment of an acoustic wave filter component. The stacked device structure 200b of the acoustic wave filter component of FIG. 4 is similar to the stacked device structure 200a of FIGS. 3A and 3B, except that the arrangement of the SAW interconnect electrode 222 is similar to that of the SAW interconnect electrode 122 of FIGS. 1A and 1B. The location of the conductive via 260b extending through the piezoelectric layer supporting the SAW interconnect electrode 222 is out of line with the conductive vias 260a and 232.

Figure 5:
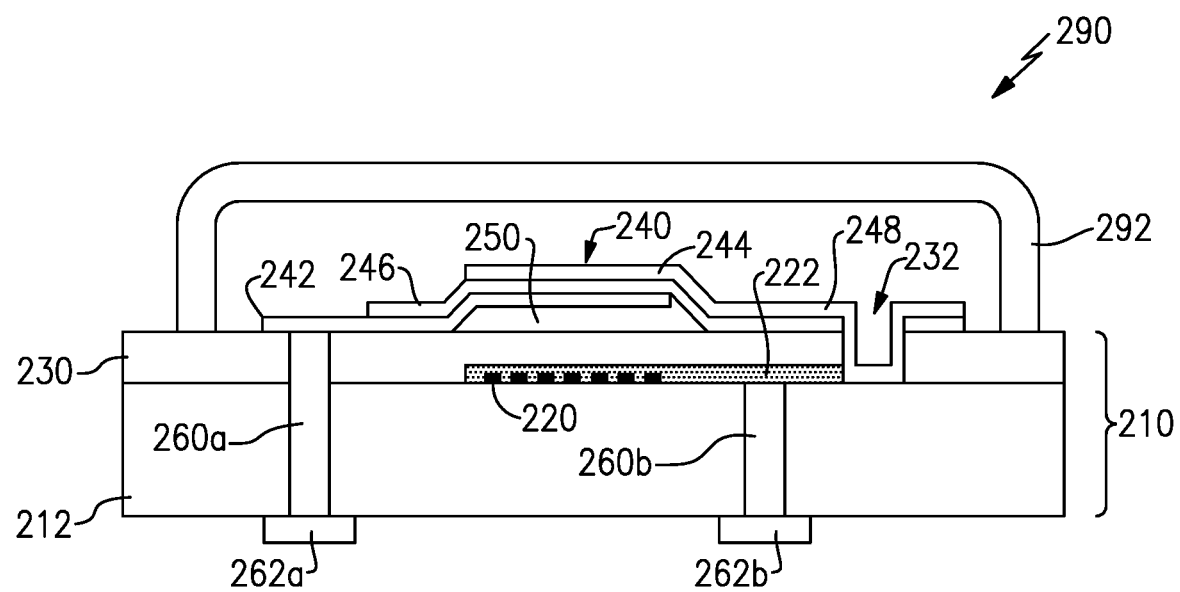
FIG. 5 illustrates a cross-section of another embodiment of an acoustic wave filter component including a piezoelectric wafer supporting a SAW device and a BAW resonator arranged in a stacked configuration illustrating a cap layer located over the BAW resonator.

FIG. 5 illustrates a cross-section of another embodiment of an acoustic wave filter component including a piezoelectric wafer supporting a SAW device and a BAW resonator arranged in a stacked configuration illustrating a cap layer located over the BAW resonator. The packaged device structure 290 of FIG. 5 is similar to the stacked device structure 200a of FIGS. 3A and 3B, except that the packaged device structure 290 also includes a cap layer 292 positioned over the BAW resonator 240. The presence of the cap layer 292 and/or other package component can inhibit direct connections with the BAW resonator 240 on the same side of the temperature compensation layer 230 as the BAW resonator 240. The use of a conductive via 260a and external connection pad 262a passing through the underlying layers allows electrical connections to be made with the BAW resonator 240 even with the presence of the cap layer 292.

In some embodiments, a conductive via such as conductive via 260a of FIG. 3A, which extends through both the piezoelectric layer 212 and the temperature compensation layer 230 may be formed as two distinct structures which are aligned with one another. In such an embodiment, a first conductive via section may be formed through the piezoelectric layer 212 and a second conductive via section may be formed through the temperature compensation layer 230. When the two conductive via sections are aligned with one another, and/or have sufficient overlap, there may be no intervening structure between the two. However, in some other embodiments, the two conductive via sections may not be aligned with one another.

Figure 6A:
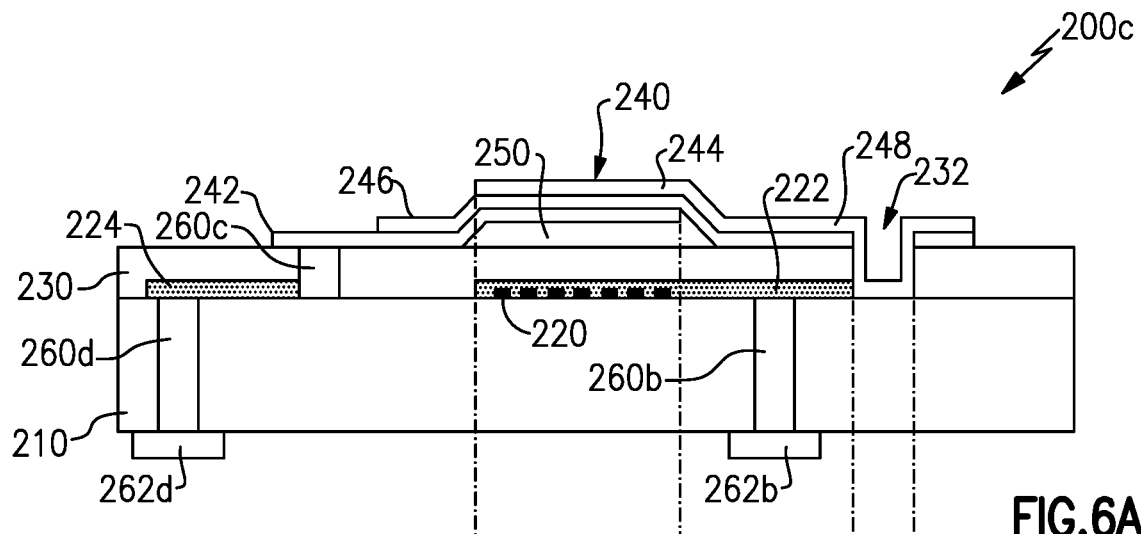
FIG. 6A illustrates a cross-section of another embodiment of an acoustic wave filter component that includes a piezoelectric wafer supporting a SAW device and a BAW resonator arranged in a stacked configuration, illustrating conductive vias extending through the piezoelectric wafer and in electrical communication with each of the SAW device and the BAW resonator.
Figure 6B:
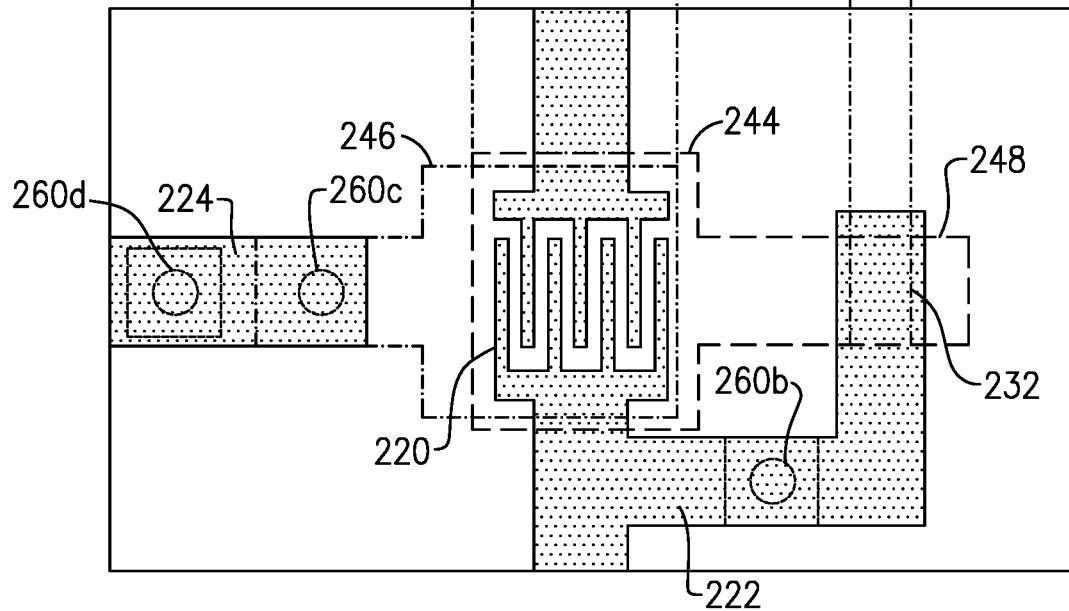
FIG. 6B illustrates a top plan view of the acoustic filter component of FIG. 6A.

FIG. 6A illustrates a cross-section of another embodiment of an acoustic wave filter component that includes a piezoelectric wafer supporting a SAW device and a BAW resonator arranged in a stacked configuration, illustrating conductive vias extending through the piezoelectric wafer and in electrical communication with each of the SAW device and the BAW resonator. FIG. 6B illustrates a top plan view of the acoustic filter component of FIG. 6A.

The stacked device structure 200c of FIG. 6A is similar to the stacked device structure 200a of FIG. 3A, but differs in that the stacked device structure 200c includes a first conductive via section 260c in electrical communication with the lower electrode 242 of the BAW resonator, where the first conductive via section 260c extends only through the temperature compensation layer 230. The stacked device structure 200c also includes a second conductive via section 260d extending only through the piezoelectric layer 212, the second conductive via section 260d terminating in or electrically connected to an external connection pad 262d. In an embodiment in which the piezoelectric layer 212 is a multi-layer structure, the second conductive via section 260d may extend through all of the layers of the multi-layer piezoelectric structure.

Because the first conductive via section 260c and the second conductive via section 260d are not aligned with one another, the stacked device structure 200c also includes a via interconnect structure 224 which forms at least part of an electrical connection between the first conductive via section 260c and the second conductive via section 260d. In the illustrated embodiment, the via interconnect structure 224 is supported by the piezoelectric layer 212. In some embodiments, the via interconnect structure may be formed at the same time and from the same material as another layer supported by the piezoelectric layer 212, such as the SAW interconnect electrode 222 or the IDT electrode 220, or a sublayer within the SAW interconnect electrode 222 or the IDT electrode 220.

The use of a via interconnect structure 224 or a similar structure can allow greater freedom in the placement of an external connection pad such as the external connection pad 262d. In some embodiments, a piezoelectric layer 212 may support a relatively large number of acoustic wave devices. The use of via interconnect structures within a layer stack, such as via interconnect structure 224, can help to place external connection pads at desired locations on the underside of the piezoelectric layer 212, independent of the locations of the resonators to which the external connection pads are connected.

Figure 7A:
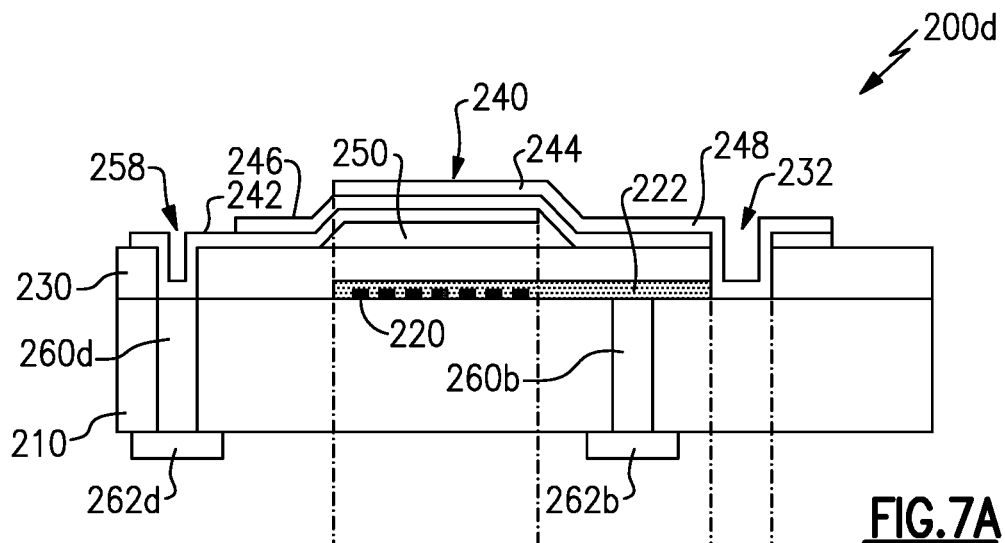
FIG. 7A illustrates a cross-section of another embodiment of an acoustic wave filter component that includes a piezoelectric wafer supporting a SAW device and a BAW resonator arranged in a stacked configuration, illustrating conductive vias extending through the piezoelectric wafer and in electrical communication with each of the SAW device and the BAW resonator.
Figure 7B:
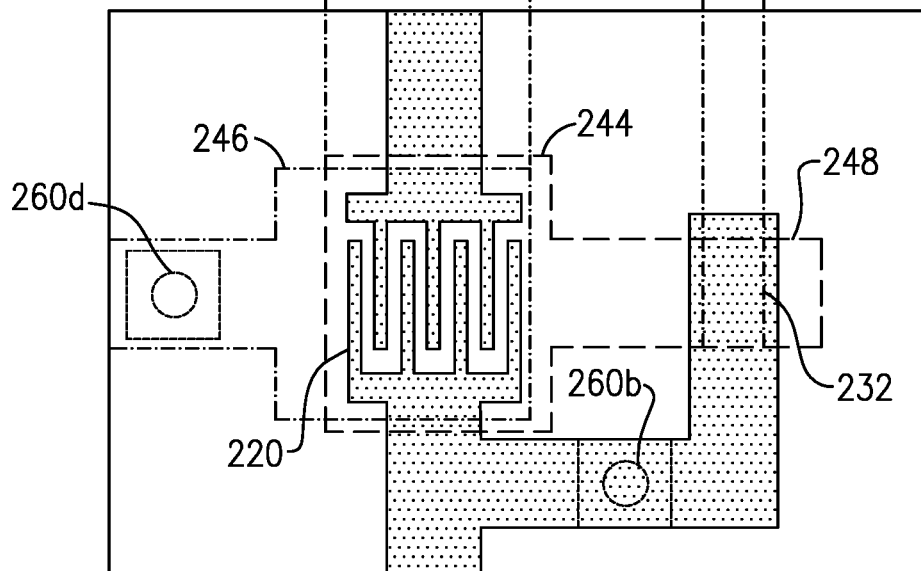
FIG. 7B illustrates a top plan view of the acoustic wave filter component of FIG. 7A.

Other combinations of the conductive vias and conductive via sections, examples of which are described herein, may alternatively or additionally be used. FIG. 7A illustrates a cross-section of another embodiment of an acoustic wave filter component that includes a piezoelectric wafer supporting a SAW device and a BAW resonator arranged in a stacked configuration, illustrating conductive vias extending through the piezoelectric wafer and in electrical communication with each of the SAW device and the BAW resonator. FIG. 7B illustrates a top plan view of the acoustic wave filter component of FIG. 7A.

The stacked device structure 200d of FIG. 7A is similar the stacked device structure 200a of FIG. 3A, but differs in that the stacked device structure 200d includes a first conductive via section 258 in electrical communication with the lower electrode 242 of the BAW resonator 240, where the first conductive via section 258 extends only through the temperature compensation layer 230. Unlike the first conductive via section 260c of FIG. 6A, the first conductive via section 258 is not a solid structure extending through the temperature compensation layer. Instead, the first conductive via section 258 can be a conformal portion of a conductive layer formed over an aperture in the temperature compensation layer, similar to conductive via 232. In the illustrated embodiment, the conductive via section 258 can be a portion of the same layer used to form the lower electrode 242 of the BAW resonator 240. In other embodiments, however, such as when the material of the lower electrode 242 of the BAW resonator 240 or the fabrication process used to form the lower electrode 242 of the BAW resonator 240 may not provide the desired conformal pattern, a separate layer may be formed using a different material and/or fabrication process.

In the illustrated embodiment, the first conductive via section 258 is aligned with a second conductive via section 260d which extends through the piezoelectric layer 212 and terminates in or is electrically connected to an external connection pad 262d. Because of the alignment between the first and second conductive via sections 258 and 260d, no via interconnect structure is used to connect the two conductive via sections 258 and 260d. However, in other embodiments, the conductive via sections 258 and 260d may be offset from one another, and connected to one another by means of a via interconnect structure such as via interconnect structure 224 of FIGS. 6A and 6B.

Any combination of solid via sections such as conductive via section 260d, and conformal vias or via sections such as conductive via 232 and conductive via section 258, may be used to provide desired connections between device supported by a piezoelectric layer and/or with external connection pads. In addition, via interconnect structures and device interconnect electrodes may be used to provide additional connections, and may allow for greater freedom in the placement of conductive vias and via sections, as well as in the placement of external connection pads. The conductive vias and via sections illustrated in FIGS. 3A to 7B, as well as the interconnect structures and device interconnect electrode designs, may be used in conjunction with any of the device combinations and arrangements described herein, in any suitable combination.

In some embodiments, a piezoelectric layer may support a larger number of resonators and/or devices that shown in the embodiments of FIGS. 1A to 7B. FIG. 8A illustrates a cross-section of an embodiment of an acoustic wave filter component that includes a piezoelectric wafer supporting a plurality of SAW devices and a plurality of BAW resonators arranged in a stacked orientation. FIG. 8B illustrates a top plan view of the acoustic wave filter component of FIG. 8A. The stacked devices structure 300 includes a piezoelectric layer 312 supporting a first IDT electrode 320a, a second IDT electrode 320b, and a temperature compensation layer 330. The first IDT electrode 320a, in combination with portions of the piezoelectric layer 312 and the temperature compensation layer 330, forms a first SAW device 310a. The second IDT electrode 320b, in combination with portions of the piezoelectric layer 312 and the temperature compensation layer 330, forms a second SAW device 310b.

A first BAW resonator 340a, including a lower electrode 342 and an upper electrode 344 on opposite sides of a piezoelectric layer 346, is supported by the temperature compensation layer 330. An air cavity 350 between the lower electrode 342 and the temperature compensation layer 330 is located over at least a portion of the first IDT electrode 320a. The stacked device structure 300 also includes a second BAW resonator 340b supported by the temperature compensation layer 330. The second BAW resonator 340b may be similar in structure to the first BAW resonator 340a. The second BAW resonator 340b may be entirely offset from the second IDT electrode 320b of the second SAW device 310b.

Unlike the embodiments illustrated in FIGS. 1A to 7B, in which a BAW resonator is electrically connected to a SAW device located beneath the BAW resonator, the first BAW resonator 340a is in electrical communication with the second SAW device 310b, rather than the underlying first SAW device 310a. In particular, a conductive via 332 extends between the BAW interconnect electrode 348 of the first BAW resonator 340a and the SAW interconnect electrode 322b of the second SAW device 310b.

In embodiments in which a plurality of acoustic wave devices of different types are supported by a single piezoelectric layer, the relative positioning of the devices can be independent of the manner in which those devices are connected to one another. As noted above, any suitable combination of the via and interconnect structures described herein can be used to provide desired connections between devices arranged in a stacked configuration. Similarly, external connections may be provided through any suitable combination of the via and interconnect structures described herein.

FIG. 9A illustrates a cross-section of another embodiment of an acoustic wave filter component that includes a piezoelectric wafer supporting a plurality of SAW devices and a plurality of BAW resonators arranged in a stacked orientation illustrating conductive vias extending through the piezoelectric wafer and in electrical communication with a SAW device and a BAW resonator. FIG. 9B illustrates a top plan view of the acoustic wave filter component of FIG. 9A. The stacked device structure 400 is similar to the stacked device structure 300 of FIG. 8A except that the stacked device structure 400 also includes a first conductive via 460a and a second conductive via 460b and corresponding external connection pads 460a and 460b.

The first conductive via 460a extends through the piezoelectric layer 412. An upper end of the first conductive via 460a is electrically connected to the SAW interconnect electrode 422b of the second SAW device 410b. A lower end of the first conductive via 460a terminates in or is electrically connected to a first external connection pad 462a. The first conductive via 460a provides an electrical connection between the first external connection pad 462*a* and each of the first BAW resonator 440*a* and the second SAW device 410*b*.

The second conductive via 460*b* extends through the piezoelectric layer 412 and the temperature compensation layer 430. In some embodiments, the second conductive via 460*a* may be a combination of two conductive via sections of any suitable type, a first of the two conductive via sections extending through the temperature compensation layer 430 and a second of the two conductive via sections extending through the piezoelectric layer 412. The two conductive via sections may in some embodiments be offset from one another, and connected by means of a via interconnect structure. An upper end of the second conductive via 460*b* is electrically connected to the second BAW resonator 440*b*. A lower end of the second conductive via 460*b* terminates in or is electrically connected to a second external connection pad 462*b*. The second conductive via 460*b* provides an electrical connection between the second external connection pad 462*b* and the second BAW resonator 440*b*. Additional connections, not explicitly illustrated in FIGS. 9A and 9B, may provide connections between the first SAW device 410*a* and other components.

By providing interconnected devices of different types in a stacked arrangement, a hybrid stacked resonator structure can be provided. This hybrid stacked resonator structure can have a smaller footprint than if the BAW resonators and the SAW devices were formed on separate dies and mounted next to one another. A hybrid stacked devices structure according to the various embodiments described herein can be used to reduce the overall size of a variety of hybrid devices structures, including filters which include both BAW and SAW resonators, multiplexers that include BAW and SAW resonators, and filters that include BAW resonators with a cancelation circuit that includes SAW devices.

Figure 10:
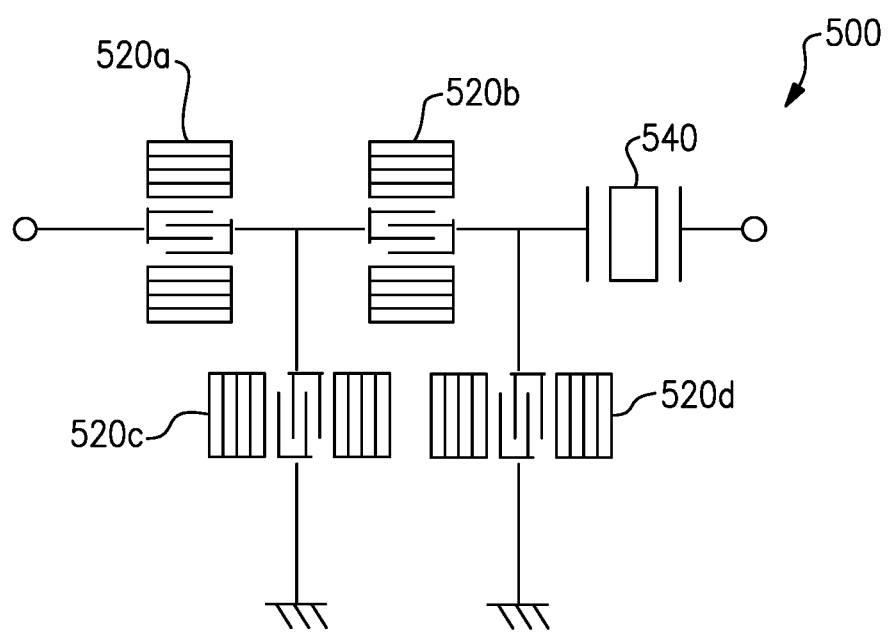
FIG. 10 schematically illustrates an embodiment of a hybrid filter.

FIG. 10 schematically illustrates an embodiment of a hybrid filter. The hybrid filter includes a plurality of SAW resonators and a BAW resonator. SAW devices can be SAW resonators in acoustic wave filters, such as the hybrid filter 500 of FIG. 10. The hybrid filter 500 includes two SAW resonators 520*a* and 520*b* arranged in series with a BAW resonator 540. The hybrid filter 500 also includes two additional SAW resonators 520*c* and 520*d* in shunt arrangements. In some embodiments, each of the SAW resonators 520*a*, 520*b*, 520*c*, and 520*d* may be supported by a single piezoelectric layer, and may include portions of a single temperature compensation layer. The BAW resonator 540 may be supported by this temperature compensation layer, and an electrical connection through the temperature compensation layer between the BAW resonator 540 and the SAW resonators 520*b* and 520*d* may be made using a conductive via extending through the temperature compensation layer.

Figure 11:
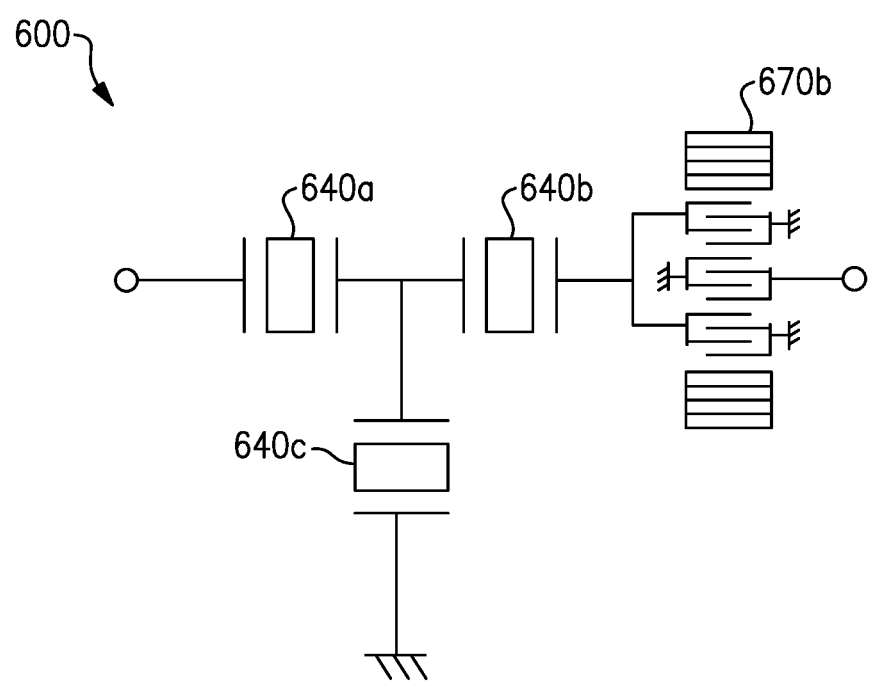
FIG. 11 schematically illustrates another embodiment of a hybrid filter.

FIG. 11 schematically illustrates another embodiment of a hybrid filter. A SAW device can be a multi-mode SAW filter, such as the hybrid filter 600 of FIG. 11. The filter includes a plurality of BAW resonators and a multi-mode surface acoustic wave filter. The hybrid filter 600 includes two BAW resonators 640*a* and 640*b* in series with a multi-mode surface acoustic wave filter 670*b*, and a third BAW resonator 640*c* in a shunt arrangement. In such an embodiment, the multi-mode surface acoustic wave filter 670*b* is included in a hybrid filter with BAW resonators 640*a*, 640*b*, and 640*c* arranged in a ladder topology. The hybrid filter 600 may be used, for example, as a receive filter.

The multi-mode surface acoustic wave filter 670*b* is a type of an acoustic wave filter that includes a plurality of IDT electrodes longitudinally coupled to each other and positioned between acoustic reflectors. These IDT electrodes may be supported by a piezoelectric layer or a multi-layer piezoelectric substrate. The multi-mode surface acoustic wave filter 670*b* may be temperature compensated by including a temperature compensation layer, such as a silicon dioxide layer, over the IDT electrodes. Some or all of the BAW resonators 640*a*, 640*b*, and 640*c* may be supported by this temperature compensation layer, and a connection between the multi-mode surface acoustic wave filter 670*b* and the BAW resonator 640*b* may include a conductive via extending through the temperature compensation layer.

Some MMS filters are referred to as double mode surface acoustic wave (DMS) filters. There may be more than two modes of such DMS filters and/or for other MMS filters. MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection. In certain applications, MMS filters can be receive filters arranged to filter radio frequency signals.

Figure 12:
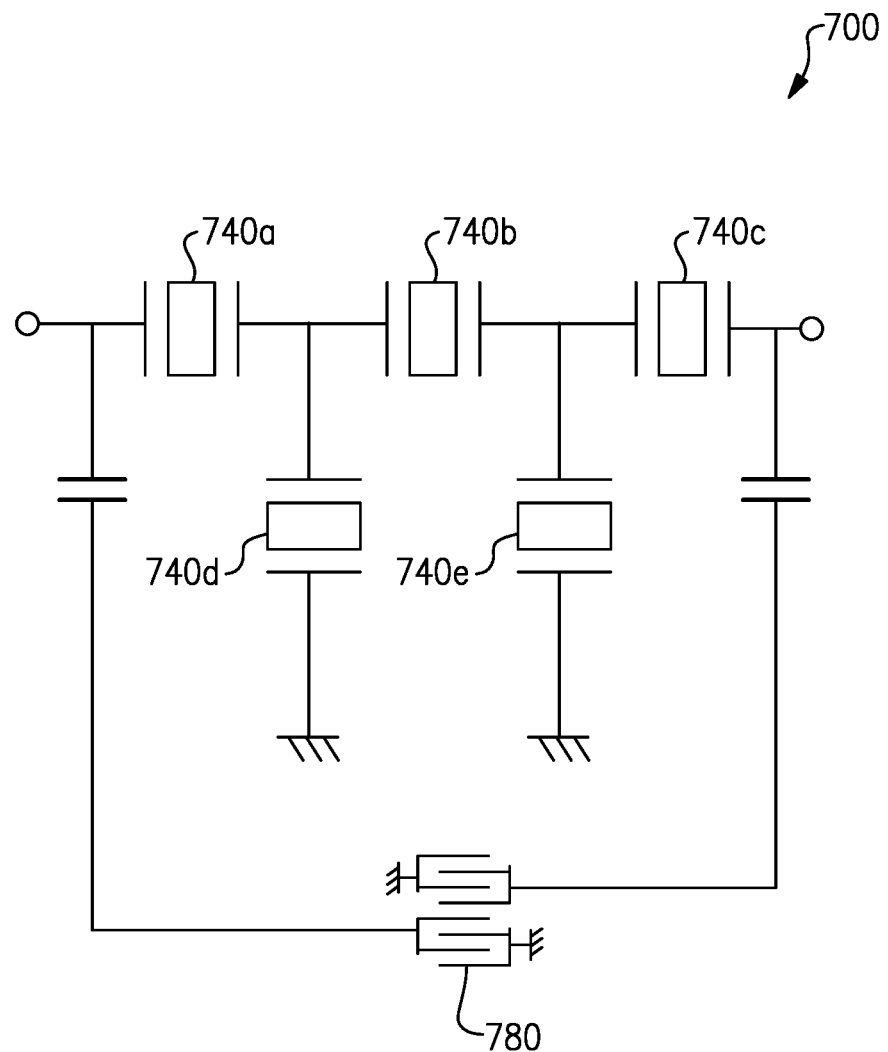
FIG. 12 schematically illustrates another embodiment of a filter.

FIG. 12 schematically illustrates another embodiment of a filter. A SAW device can be a delay element, such as the hybrid filter 700 of FIG. 12. The filter includes a plurality of BAW resonators and a cancellation circuit that includes SAW delay element. The filter 700 includes three BAW resonators 740*a*, 740*b*, and 740*c* arranged in series, with two additional BAW resonators 740*d* and 740*e* in a shunt arrangement. The filter 700 also includes a SAW cancellation circuit 780 capacitively coupled to the ladder arrangement of BAW resonators 740*a*, 740*b*, 740*c*, 740*d*, and 740*e*. The capacitively coupled SAW cancellation circuit 780 may achieve higher rejection of the filter 700, for example, by generating an anti-phase signal to a target signal at a particular frequency.

The SAW cancellation circuit 780 may include an IDT electrode supported by a piezoelectric layer and may also include a portion of a temperature compensation layer overlying the IDT electrodes. At least some of the BAW resonators 740*a*, 740*b*, 740*c*, 740*d*, and 740*e* may be supported by the temperature compensation layer, and electrical connections may be made through the temperature compensation layer between the BAW resonators 740*a* and 740*c* and the SAW cancellation circuit 780, such as by using a conductive via extending through the temperature compensation layer.

Figure 13:
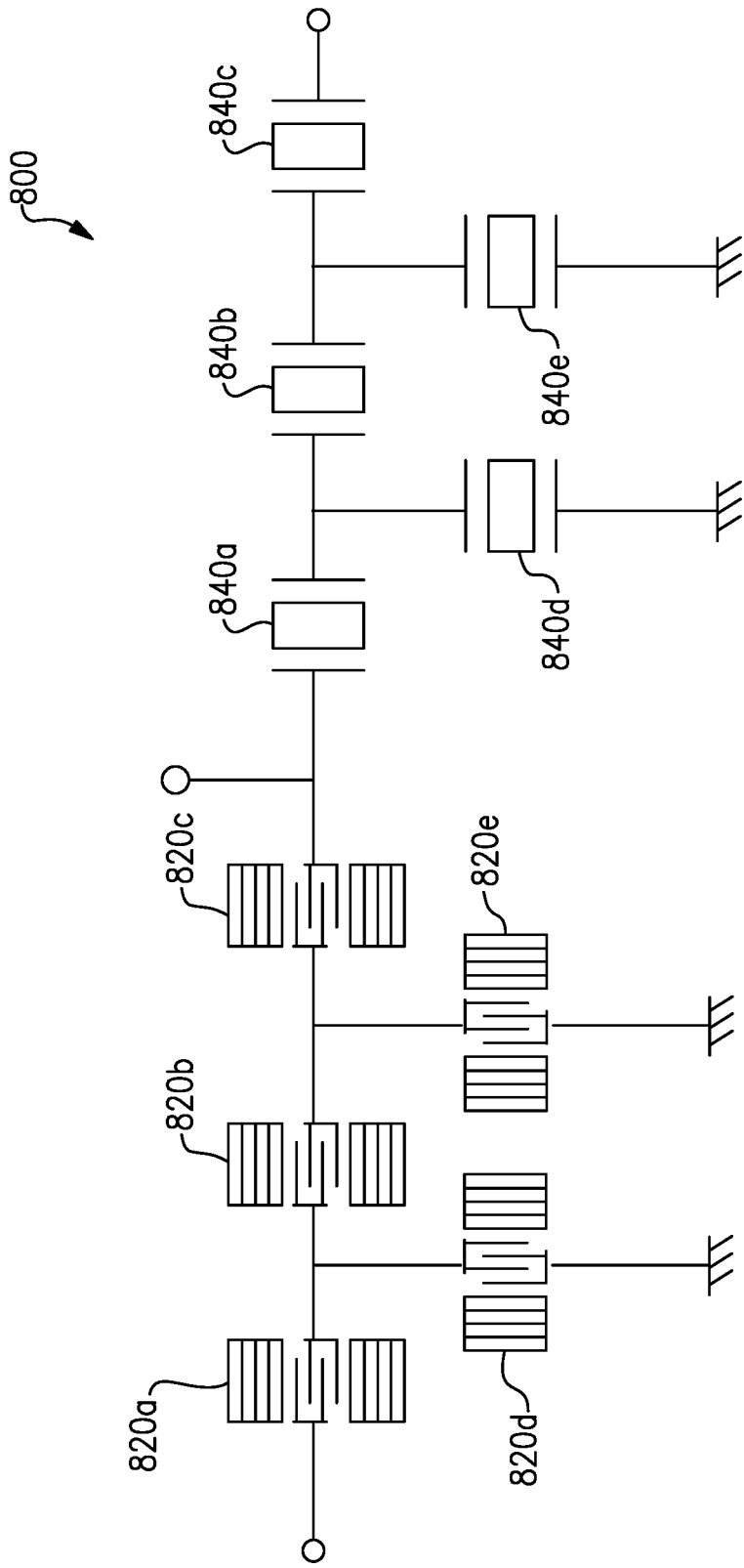
FIG. 13 schematically illustrates an embodiment of a multiplexer.

FIG. 13 schematically illustrates an embodiment of a multiplexer. The multiplexer includes a plurality of SAW resonators and a plurality of BAW resonators. In the illustrated embodiment, the multiplexer 800 includes a first filter with three series SAW resonators 820*a*, 820*b*, and 820*c* and two shunt SAW resonators 820*d* and 820*e*. In addition, the multiplexer 800 includes a second filter with three series BAW resonators 840*a*, 840*b*, and 840*c*, along with two shunt BAW resonators 840*d* and 840*e*.

At least some of the SAW resonators 820*a*, 820*b*, 820*c*, 820*d*, and 820*e* may include IDT electrodes supported by a piezoelectric layer and may also include portions of a temperature compensation layer overlying the IDT electrodes. At least some of the BAW resonators 840*a*, 840*b*, 840*c*, 840*d*, and 840*e* may be supported by the temperature compensation layer, and electrical connections may be made through the temperature compensation layer between the BAW resonator 840*a* and the SAW resonator 820*c*, such as by using a conductive via extending through the temperature compensation layer.

Figure 14:
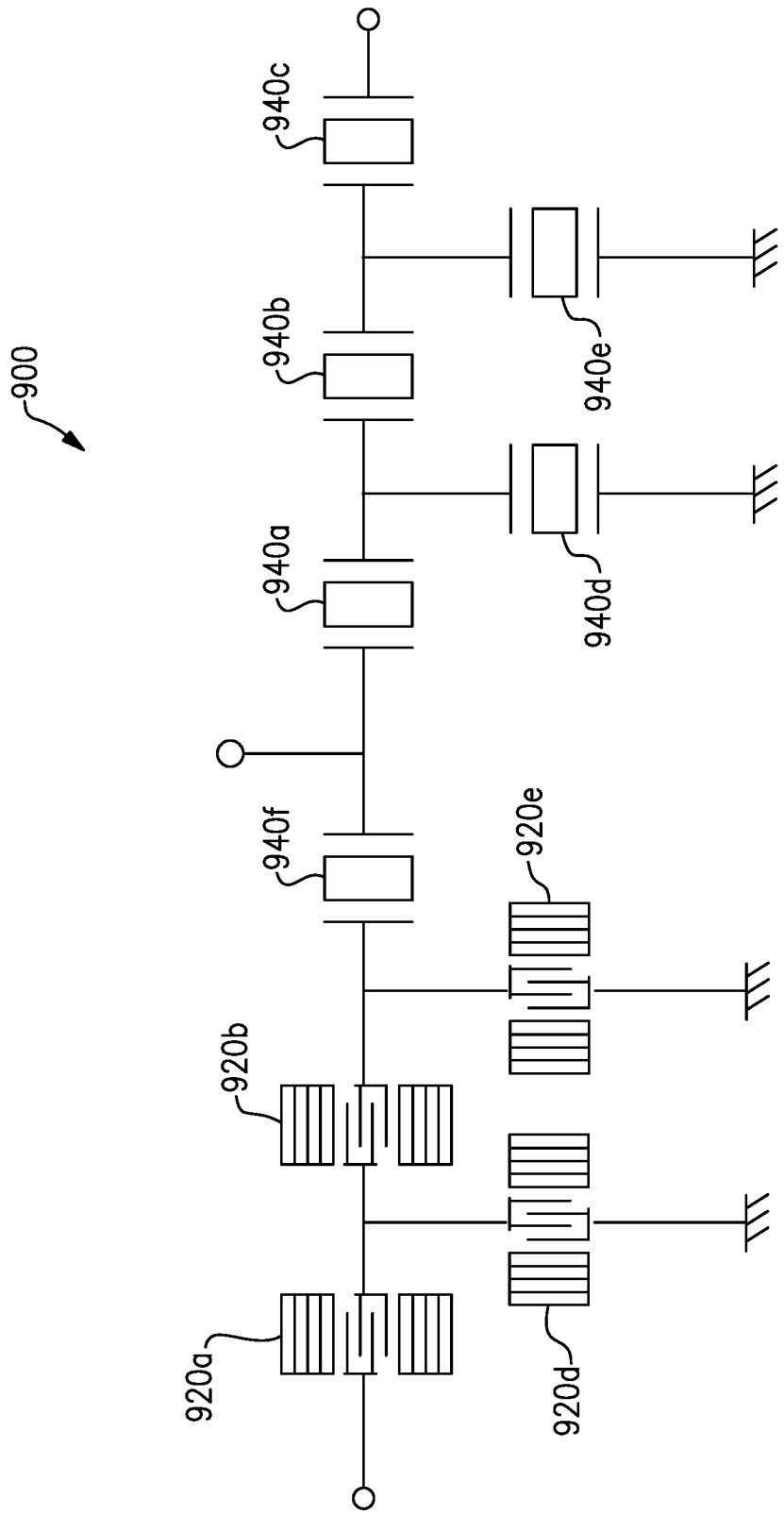
FIG. 14 schematically illustrates another embodiment of a multiplexer.

FIG. 14 schematically illustrates another embodiment of a multiplexer. The multiplexer includes a plurality of SAW resonators and a plurality of BAW resonators. The multiplexer 900 is similar to the multiplexer 800 of FIG. 13, except that a BAW resonator 940*f* has been included in place of a series SAW resonator closest to a common node at which the filters of the multiplexer 900 are coupled to each other. Like the multiplexer 800, at least some of the SAW resonators 920*a*, 920*b*, 920*c*, and 920*d*, may include IDT electrodes supported by a piezoelectric layer and may also include portions of a temperature compensation layer overlying the IDT electrodes. At least some of the BAW resonators 940*a*, 940*b*, 940*c*, 940*d*, 940*e*, and 940*f* may be supported by the temperature compensation layer. Electrical connection may be made through the temperature compensation layer between the BAW resonator 940*f* and the SAW resonators 920*b* and 920*d* using one or more conductive vias extending through the temperature compensation layer.

Figure 15:
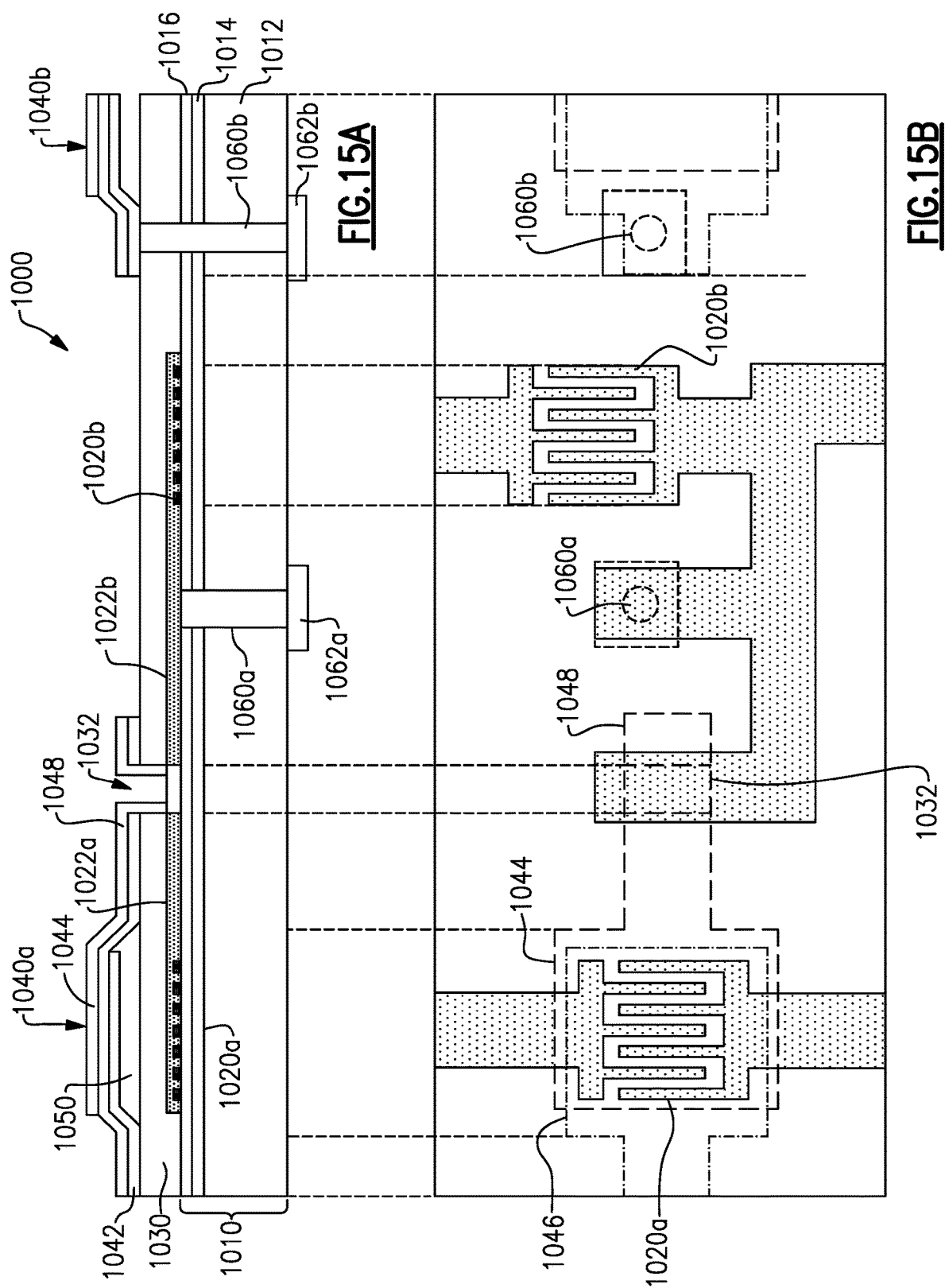
FIG. 15A illustrates a cross-section of an embodiment of an acoustic wave filter component that includes a multilayer piezoelectric substrate supporting a plurality of SAW devices and a plurality of BAW resonators arranged in a stacked orientation.
FIG. 15B illustrates a top plan view of the acoustic wave filter component of FIG. 15A.

FIG. 15A illustrates a cross-section of an embodiment of an acoustic wave filter component that includes a multilayer piezoelectric substrate supporting a plurality of SAW devices and a plurality of BAW resonators arranged in a stacked orientation. FIG. 15B illustrates a top plan view of the acoustic wave filter component of FIG. 15A. The stacked device structure 1000 of FIG. 15A is similar to the stacked device structure 400 of FIG. 9A, but rather than a single piezoelectric layer 412, the stacked device structure 1000 includes a multi-layer piezoelectric substrate 1010. The multi-layer piezoelectric substrate 1010 includes a piezoelectric layer 1016 supported by support substrate 1012, and a functional layer 1014 between the piezoelectric layer 1016 and the support substrate 1012. The conductive vias 1060*a* and 1060*b* extend through portions of the functional layer 1014 and the support substrate 1012. External connection pads 1062*a* and 1062*b* are located on the underside of the support substrate 1012.

In some embodiments, the support substrate 1012 may include silicon (Si). According to some other embodiments, the support substrate 1012 can include any other suitable material, including but not limited to sapphire, aluminum oxide ($Al_2O_3$), aluminum nitride (AlN), quartz, aluminum magnesium spinel, or ceramic materials. The functional layer may include a silicon dioxide layer, although other suitable materials may also be used. Although the multilayer piezoelectric substrate 1010 is illustrated as including three layers, one or more additional layers may also be included or only the support substrate 1012 and the piezoelectric layer 1016 can be included.

In some embodiments, BAW resonators may be arranged in a stacked arrangement with one or more other types of acoustic wave devices. FIG. 11 illustrates a cross-section of an embodiment of an acoustic wave filter component that includes a plurality of boundary wave resonators arranged in a stacked orientation, and a plurality of BAW resonators supported by the plurality of boundary wave resonators. The stacked resonator arrangement 1100 includes three support substrates: a first support substrate 1112*a*, a second support substrate 1112*b* positioned over the first support substrate 1112*a*, and a third support substrate 1112*c* positioned over the second support substrate 1112*b*. The stacked resonator arrangement 1100 also includes a first BAW resonator 1140*a* and a second BAW resonator 1140*b* supported by the third support substrate 1112*c*.

At least a first boundary wave resonator IDT electrode 1120*a* is located between the first and second support substrates 1112*a* and 1112*b*. The first boundary wave resonator IDT electrode 1120*a* is supported by a first piezoelectric layer 1116*a*. A first low-velocity layer 1130*a* overlies the first boundary wave resonator IDT electrode 1120*a*. The low-velocity layer 1130*a* may include, for example, silicon dioxide ($SiO_2$), or another suitable material, which has a lower bulk velocity than the material of the first and second support substrates 1112*a* and 1112*b*, which may include, for example, silicon (Si) or another suitable material. The first and second support substrates 1112*a* and 1112*b* may also be referred to as high-velocity layers.

In the illustrated embodiment, a functional layer 1114*a* is located between the first boundary wave resonator IDT electrode 1120*a* and the first piezoelectric layer 1116*a*. The functional layer 1114*a* may serve as a temperature compensation and adhesion layer. In some embodiments, the functional layer 1114*a* may include $SiO_2$, although other suitable materials may also be used. An adhesion layer 1118*a* is located over the first low-velocity layer 1130*a*, between the low-velocity layer 1130*a* and the second support substrate 1112*b*. The adhesion layer 1118*a* may include $SiO_2$, although other suitable materials may also be used. In other embodiments, the additional layers 1114*a* and 1118*a* may be omitted. The first boundary wave resonator IDT electrode 1120*a* forms a first boundary wave resonator, in conjunction with a portion of the first low-velocity layer 1130*a* and the a portion of the first piezoelectric layer 1116*a*, which is bounded on either side by the high-velocity layers of the first and second support substrates 1112*a* and 1112*b*.

At least a second boundary wave resonator IDT electrode 1120*b* is located between the second and third support substrates 1112*b* and 1112*c*. The second boundary wave resonator IDT electrode 1120*b* is supported by a second piezoelectric layer 1116*b*. A second functional 1114*b* is located between the second boundary wave resonator IDT electrode 1120*b* and the second piezoelectric layer 1116*b*. A second low-velocity layer 1130*b* overlies the second boundary wave resonator IDT electrode 1120*b*. A second adhesion layer 1118*b* is located over the second low-velocity layer 1130*b*, between the second low-velocity layer 1130*b* and the third support substrate 1112*c*. The second boundary wave resonator IDT electrode 1120*b*, in conjunction with a portion of the second piezoelectric layer 1116*b* and a portion of the second low-velocity layer 1130*b*, forms a second boundary wave resonator.

Connections to external connection pads 1162*a*, 1162*b*, and 1162*c* on the underside of support substrates are provided by means of conductive vias 1160*a*, 1160*b*, and 1160*c*. The first conductive via 1160*a* is electrically connected to the first boundary wave resonator IDT electrode 1120*a* by means of first boundary wave interconnect electrode 1122*a*. The second conductive via 1160*b* is electrically connected to the second boundary wave resonator IDT electrode 1120*b* by means of first boundary wave interconnect electrode 1122*b*, and may also connect to the first boundary wave resonator IDT electrode 1120*a* by means of first boundary wave interconnect electrode 1122*a*. The third conductive via 1160*c* is electrically connected to the lower electrode of the second BAW resonator 1140*b*. In other embodiments, additional or alternative connections, both between resonators and between external connection pads, may be made using any of the conductive vias and interconnect structures described herein, or any other suitable type of conductive via or interconnect structure.

In addition to boundary wave resonators, any other suitable acoustic wave devices and/or resonators may be provided in a stacked arrangement with three or more layers of acoustic wave devices in accordance with any suitable principles and advantages disclosed herein. For example, a stacked device component may include multiple layers of SAW device, with an upper layer of one or more BAW resonators. In embodiments of such a stacked device arrangement, BAW resonators may be located only at the upper layer of the stacked device arrangement.

Figure 17:
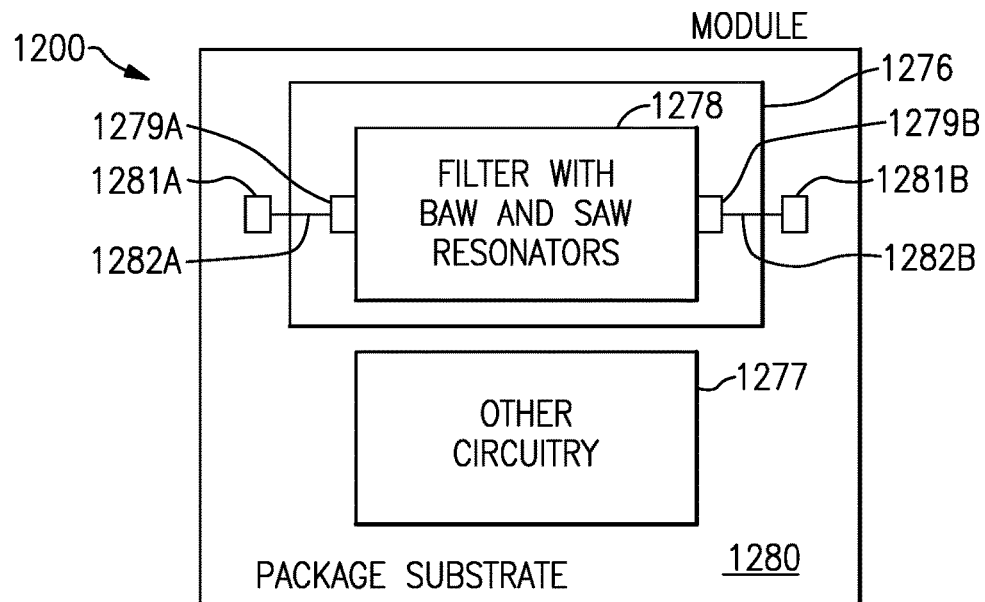
FIG. 17 is a schematic diagram of a radio frequency module that includes a surface acoustic wave component according to an embodiment.

FIG. 17 is a schematic diagram of a radio frequency module 1200 that includes a surface acoustic wave component 1276 according to an embodiment. The illustrated radio frequency module 1200 includes the resonator component 1276 and other circuitry 1277. The resonator component 1276 can include one or more BAW resonators and one or more SAW resonators with any suitable combination of features of the resonator arrangements disclosed herein. The resonator component 1276 can include a die that includes BAW resonators located over SAW resonators.

The resonator component 1276 shown in FIG. 17 includes a filter 1278 and terminals 1279A and 1279B. The filter 1278 includes one or more BAW resonators and one or more SAW resonators. One or more of the BAW resonators can be located over one or more of the SAW resonators in accordance with any suitable principles and advantages disclosed herein. In addition, two or more of the resonators of the filter 1278 can be in a stacked resonator package such as the stacked device structure 100 of FIG. 1A. The terminals 1279A and 1278B can serve, for example, as an input contact and an output contact, and may be in electrical communication with a conductive via extending through at least a piezoelectric layer. The resonator component 1276 and the other circuitry 1277 are on or supported by a common packaging substrate 1280 in FIG. 17. The package substrate 1280 can be a laminate substrate. The terminals 1279A and 1279B can be electrically connected to contacts 1281A and 1281B, respectively, on or supported by the packaging substrate 1280 by way of electrical connectors 1282A and 1282B, respectively. The electrical connectors 1282A and 1282B can be bumps or wire bonds, for example. The other circuitry 1277 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1200 can include one or more packaging structures to, for example, provide protection and/or facilitate easier handling of the radio frequency module 1200. Such a packaging structure can include an overmold structure formed over the packaging substrate 1280. The overmold structure can encapsulate some or all of the components of the radio frequency module 1200.

Figure 18:
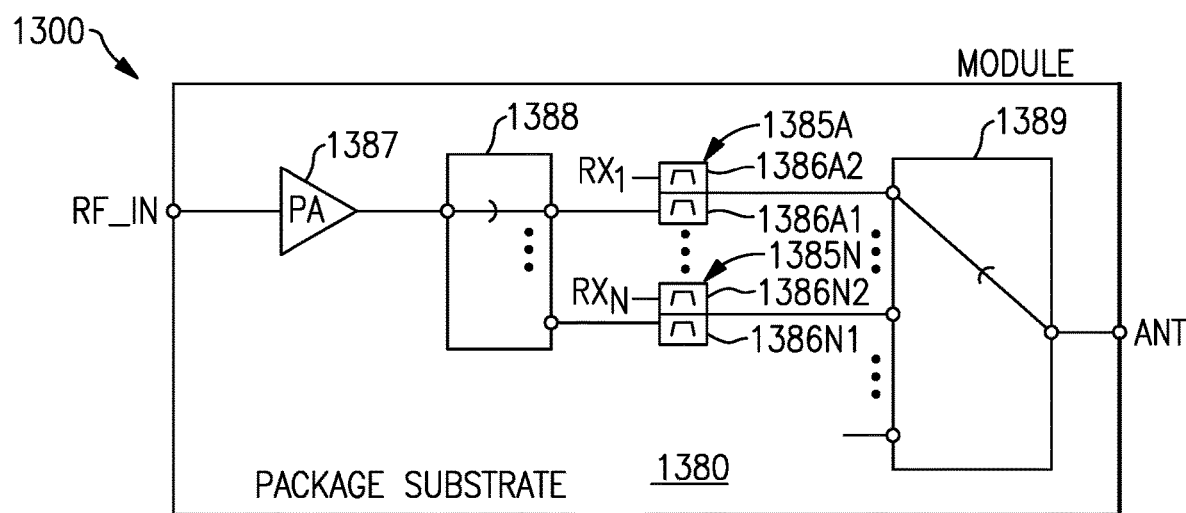
FIG. 18 is a schematic diagram of a radio frequency module that includes a resonator component according to an embodiment.

FIG. 18 is a schematic diagram of a radio frequency module 1300 that includes a resonator component according to an embodiment. As illustrated, the radio frequency module 1300 includes duplexers 1385A to 1385N that include respective transmit filters 1386A1 to 1386N1 and respective receive filters 1386A2 to 1386N2, a power amplifier 1387, a select switch 1388, and an antenna switch 1389. The radio frequency module 1300 can include a package that encloses the illustrated elements. The illustrated elements can be disposed on a common packaging substrate 1380. The packaging substrate can be a laminate substrate, for example.

The duplexers 1385A to 1385N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 1386A1 to 1386N1 can include one or more BAW resonators and one or more SAW resonators in accordance with any suitable principles and advantages disclosed herein. Similarly, one or more of the receive filters 1386A2 to 1386N2 can include one or more BAW resonators and one or more SAW resonators in accordance with any suitable principles and advantages disclosed herein. Although FIG. 18 illustrates duplexers, any suitable principles and advantages disclosed herein can be implemented in other multiplexers (e.g., quadplexers, hexaplexers, octoplexers, etc.) and/or in switch-plexers.

The power amplifier 1387 can amplify a radio frequency signal. The illustrated switch 1388 is a multi-throw radio frequency switch. The switch 1388 can electrically couple an output of the power amplifier 1387 to a selected transmit filter of the transmit filters 1386A1 to 1386N1. In some instances, the switch 1388 can electrically connect the output of the power amplifier 1387 to more than one of the transmit filters 1386A1 to 1386N1. The antenna switch 1389 can selectively couple a signal from one or more of the duplexers 1385A to 1385N to an antenna port ANT. The duplexers 1385A to 1385N can be associated with different frequency bands and/or different modes of operation (e.g., different power modes, different signaling modes, etc.).

Figure 19:
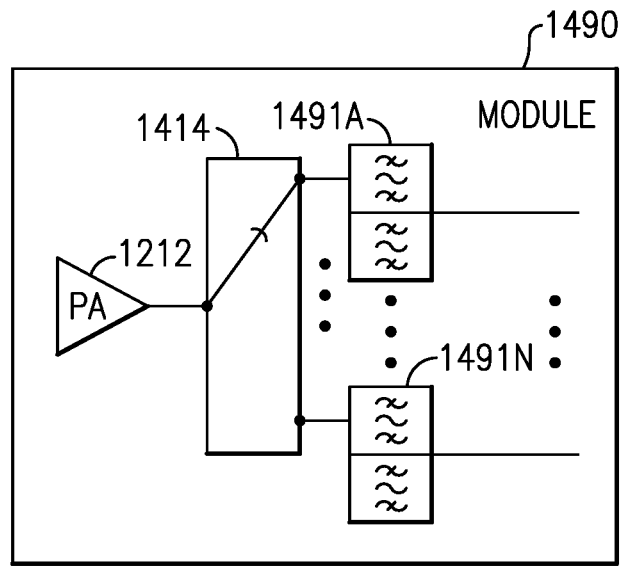
FIG. 19 is a schematic block diagram of a module that includes a power amplifier, a radio frequency switch, and duplexers according to an embodiment.

FIG. 19 is a schematic block diagram of a module 1490 that includes a power amplifier 1212, a radio frequency switch 1414, and duplexers 1491A to 1491N in accordance with one or more embodiments. The power amplifier 1212 can amplify a radio frequency signal. The radio frequency switch 1414 can be a multi-throw radio frequency switch. The radio frequency switch 1414 can electrically couple an output of the power amplifier 1212 to a selected transmit filter of the duplexers 1491A to 1491N. One or more filters of the duplexers 1491A to 1491N can include any suitable number of BAW resonators and SAW resonators in accordance with any suitable principles and advantages discussed herein. Any suitable number of duplexers 1491A to 1491N can be implemented.

Figure 20:
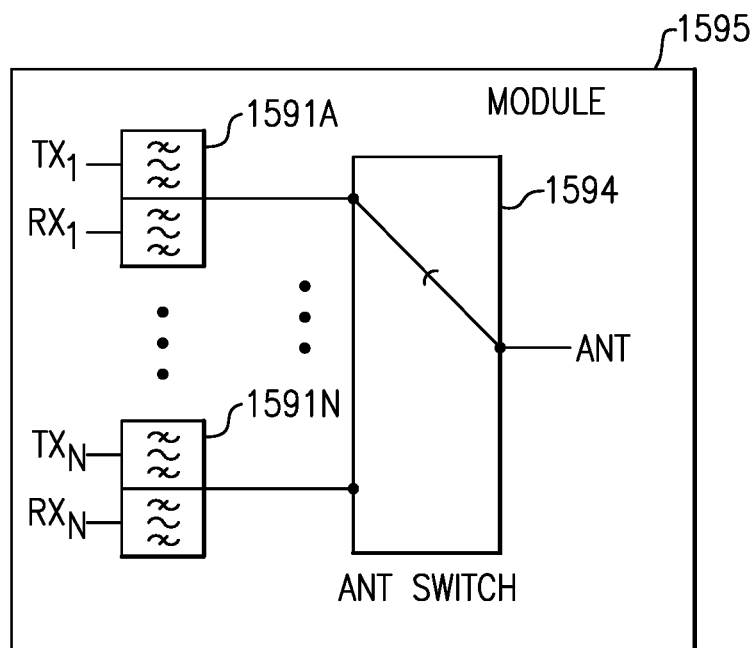
FIG. 20 is a schematic block diagram of a module that includes an antenna switch and duplexers according to an embodiment.

FIG. 20 is a schematic block diagram of a module 1595 that includes duplexers 1591A to 1591N and an antenna switch 1594. One or more filters of the duplexers 1591A to 1591N can include any suitable number of BAW resonators and SAW resonators in accordance with any suitable principles and advantages discussed herein. Any suitable number of duplexers 1591A to 1591N can be implemented. The antenna switch 1594 can have a number of throws corresponding to the number of duplexers 1591A to 1591N. The antenna switch 1594 can electrically couple a selected duplexer to an antenna port of the module 1595.

Figure 21:
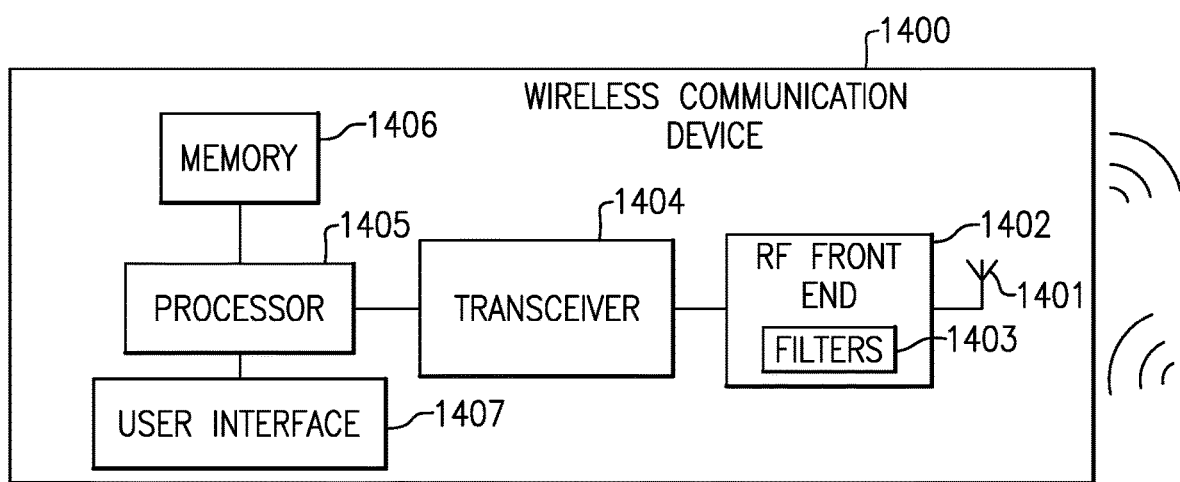
FIG. 21 is a schematic block diagram of a wireless communication device that includes a filter in accordance with one or more embodiments.

FIG. 21 is a schematic diagram of a wireless communication device 1400 that includes filters 1403 in a radio frequency front end 1402 according to an embodiment. The filters 1403 can include one or more BAW resonators and one or more SAW resonators in accordance with any suitable principles and advantages discussed herein. The wireless communication device 1400 can be any suitable wireless communication device. For instance, a wireless communication device 1400 can be a mobile phone, such as a smart phone. As illustrated, the wireless communication device 1400 includes an antenna 1401, an RF front end 1402, a transceiver 1404, a processor 1405, a memory 1406, and a user interface 1407. The antenna 1401 can transmit RF signals provided by the RF front end 1402. Such RF signals can include carrier aggregation signals. Although not illustrated, the wireless communication device 1400 can include a microphone and a speaker in certain applications.

The RF front end 1402 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1402 can transmit and receive RF signals associated with any suitable communication standards. The filters 1403 can include BAW resonators and/or SAW resonators of a resonator component that includes any suitable combination of features discussed with reference to any embodiments discussed above.

The transceiver 1404 can provide RF signals to the RF front end 1402 for amplification and/or other processing. The transceiver 1404 can also process an RF signal provided by a low noise amplifier of the RF front end 1402. The transceiver 1404 is in communication with the processor 1405. The processor 1405 can be a baseband processor. The processor 1405 can provide any suitable base band processing functions for the wireless communication device 1400. The memory 1406 can be accessed by the processor 1405. The memory 1406 can store any suitable data for the wireless communication device 1400. The user interface 1407 can be any suitable user interface, such as a display with touch screen capabilities.

Figure 22:
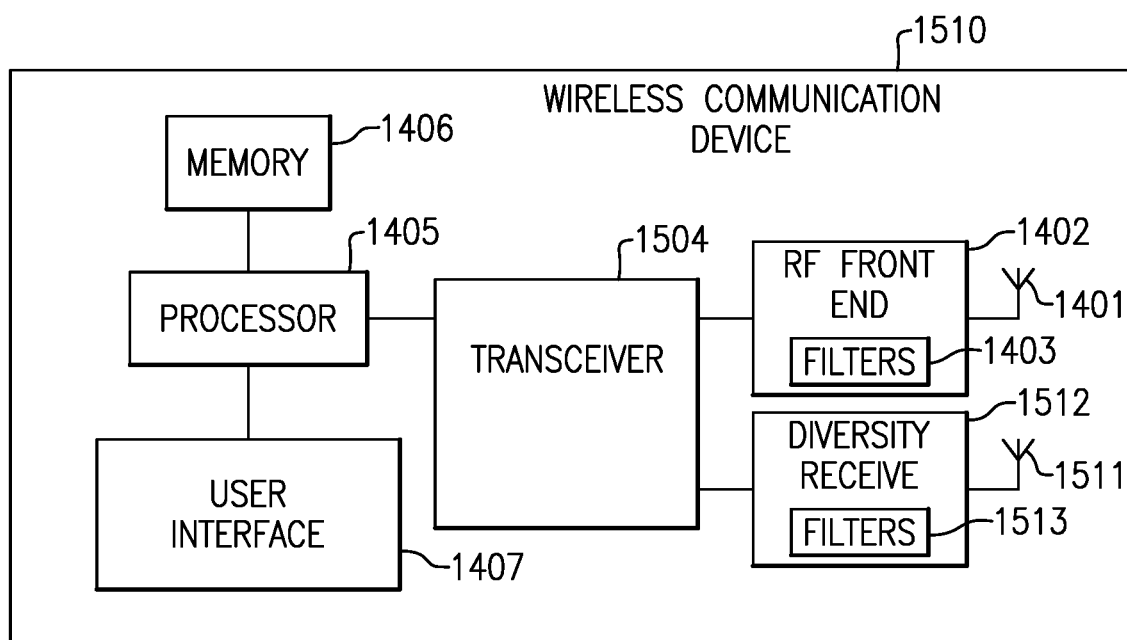
FIG. 22 is a schematic block diagram of another wireless communication device that includes a filter in accordance with one or more embodiments.

FIG. 22 is a schematic diagram of a wireless communication device 1510 that includes filters 1503 in a radio frequency front end 1502 and second filters 1513 in a diversity receive module 1512. The wireless communication device 1510 is like the wireless communication device 1500 of FIG. 21, except that the wireless communication device 1520 also includes diversity receive features. As illustrated in FIG. 22, the wireless communication device 1520 includes a diversity antenna 1511, a diversity module 1512 configured to process signals received by the diversity antenna 1511 and including filters 1513, and a transceiver 1504 in communication with both the radio frequency front end 1502 and the diversity receive module 1512. The filters 1513 can include one or more BAW resonators and one or more SAW resonators that include any suitable combination of features discussed with reference to any embodiments discussed above.

Figure 16:
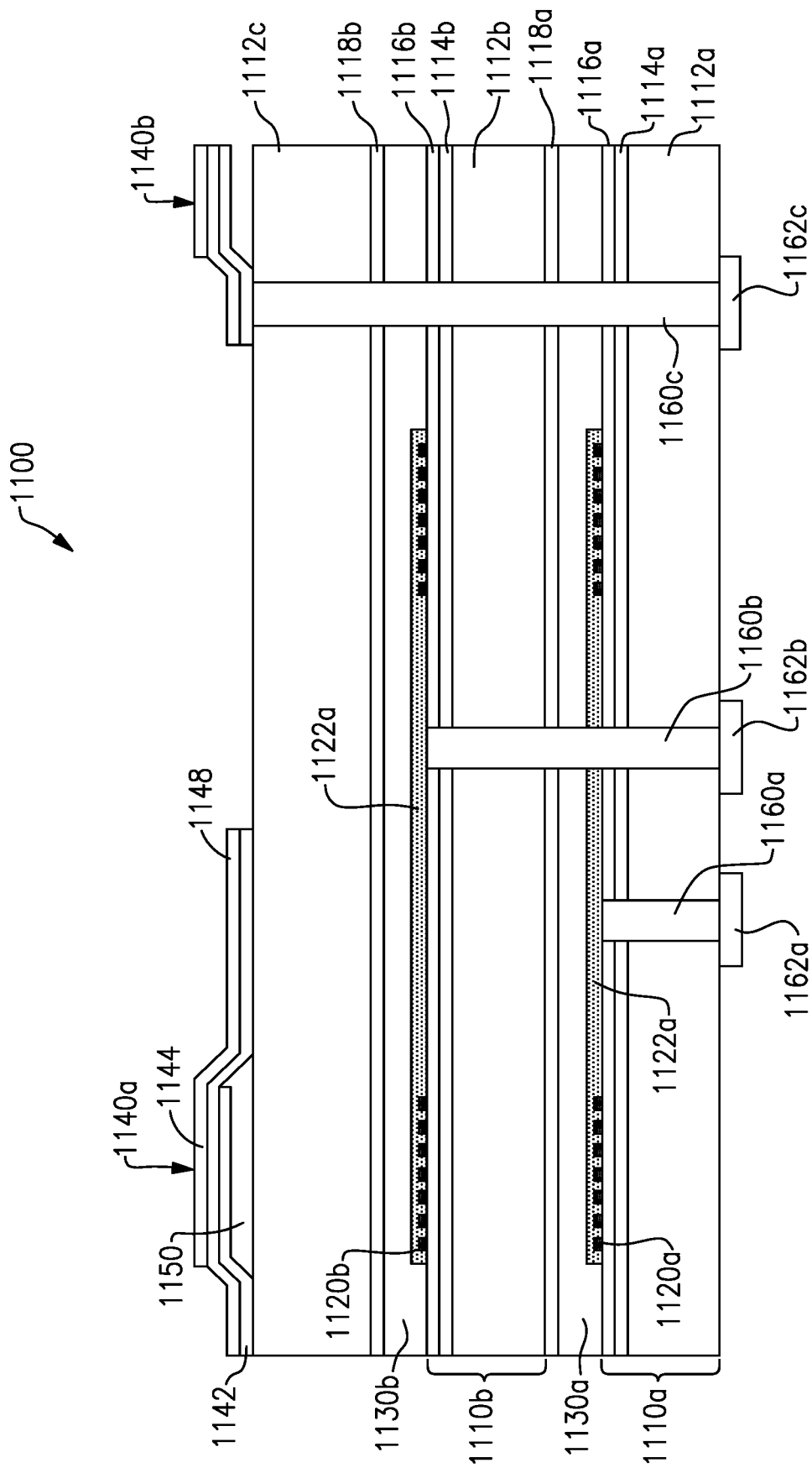
FIG. 16 illustrates a cross-section of an embodiment of an acoustic wave filter component that includes a plurality of boundary wave resonators arranged in a stacked orientation, and a plurality of BAW resonators supported by the plurality of boundary wave resonators.

Although embodiments disclosed herein relate to bulk acoustic wave resonators and surface acoustic wave devices, any suitable principles and advantages disclosed herein can be applied to other types of acoustic wave resonators, such as boundary wave resonators as described with respect to FIG. 16 and/or Lamb wave resonators. Any suitable combination of acoustic wave devices may be arranged in a stacked arrangement, with bulk acoustic wave resonators, if present, located in the upper layer of the stacked arrangement.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave filter including any suitable combination of features disclosed herein can be arranged to filter a radio frequency signal in a fifth generation (5G) New Radio (NR) operating band within Frequency Range 1 (FR1). A filter arranged to filter a radio frequency signal in a 5G NR operating band can include one or more devices of any of the stacked device arrangements disclosed herein. FR1 can be from 410 MHz to 7.125 GHz, for example, as specified in a current 5G NR specification. One or more acoustic wave filters in accordance with any suitable principles and advantages disclosed herein can be arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave filter component comprising:
a multi-layer piezoelectric substrate acoustic wave device that is a boundary wave resonator including a first support substrate, a first piezoelectric layer on the first support substrate, and an interdigital transducer electrode on the first piezoelectric layer;
a second support substrate over the interdigital transducer electrode;
a temperature compensation layer located between the interdigital transducer electrode and the second support substrate; and
a bulk acoustic wave resonator supported by the second support substrate, the bulk acoustic wave resonator including a second piezoelectric layer and electrodes on opposing sides of the second piezoelectric layer.

2. The acoustic wave filter component of claim 1 wherein the multi-layer piezoelectric substrate acoustic wave device is a multi-layer piezoelectric substrate surface acoustic wave device.

3. The acoustic wave filter component of claim 1 further comprising an internal via extending through the first support substrate, the boundary wave resonator in electrical communication with a second boundary wave resonator by way of the internal via extending through the first support substrate.

4. The acoustic wave filter component of claim 1 further comprising an internal via extending through the first and second support substrates, a second boundary wave resonator in electrical communication with the bulk acoustic wave resonator by way of the internal via extending through the first and second support substrates.

5. An acoustic wave filter component comprising:
a first boundary wave resonator supported by a first portion of a first support substrate, the first boundary wave resonator including a first piezoelectric layer and an interdigital transducer electrode on the first piezoelectric layer;
a bulk acoustic wave resonator supported by a second support substrate, the second support substrate positioned over the first boundary wave resonator, the bulk acoustic wave resonator located on an opposite side of the second support substrate as the interdigital transducer electrode of the first boundary wave resonator; and
an internal via extending through the first support substrate, the first boundary wave resonator in electrical communication with a second boundary wave resonator by way of the internal via extending through the first support substrate.

6. An acoustic wave filter component comprising:
a first boundary wave resonator supported by a first portion of a first support substrate, the first boundary wave resonator including a first piezoelectric layer and an interdigital transducer electrode on the first piezoelectric layer;
a bulk acoustic wave resonator supported by a second support substrate, the second support substrate positioned over the first boundary wave resonator, the bulk acoustic wave resonator located on an opposite side of the second support substrate as the interdigital transducer electrode of the first boundary wave resonator; and
an internal via extending through the first and second support substrates, a second boundary wave resonator in electrical communication with the bulk acoustic wave resonator by way of the internal via extending through the first and second support substrates.

7. An acoustic wave filter component comprising:
a boundary wave resonator supported by a first portion of a first support substrate, the boundary wave resonator including a first piezoelectric layer and an interdigital transducer electrode on the first piezoelectric layer;
a bulk acoustic wave resonator supported by a second support substrate, the second support substrate positioned over the boundary wave resonator, the bulk acoustic wave resonator located on an opposite side of the second support substrate as the interdigital transducer electrode of the boundary wave resonator; and
a low velocity layer located between the first piezoelectric layer and the second support substrate.

8. The acoustic wave filter component of claim 7 wherein the boundary wave resonator is a surface acoustic wave device.

9. The acoustic wave filter component of claim 7 wherein the interdigital transducer electrode is located between the first piezoelectric layer and the low velocity layer.

10. The acoustic wave filter component of claim 7 further comprising an external via extending through the first support substrate and in electrical communication with the boundary wave resonator, and the external via is in electrical communication with an external connection pad on the opposite side of the acoustic wave filter component as the boundary wave resonator.

11. An acoustic wave filter component comprising:
a first boundary wave resonator supported by a first portion of a first support substrate, the first boundary wave resonator including a first piezoelectric layer and an interdigital transducer electrode on the first piezoelectric layer;
a bulk acoustic wave resonator supported by a second support substrate, the second support substrate positioned over the first boundary wave resonator the bulk acoustic wave resonator located on an opposite side of the second support substrate as the interdigital transducer electrode of the first boundary wave resonator; and
a third support substrate located on the opposite side of the first support substrate as the second support substrate, and a second boundary wave resonator, the second boundary wave resonator including a second piezoelectric layer and a second interdigital transducer electrode on the second piezoelectric layer.

12. The acoustic wave filter component of claim 11 further comprising an internal via extending through the first support substrate, the first boundary wave resonator in electrical communication with the second boundary wave resonator by way of the internal via extending through the first support substrate.

13. The acoustic wave filter component of claim 11 further comprising an internal via extending through the first and second support substrates, the second boundary wave resonator in electrical communication with the bulk acoustic wave resonator by way of the internal via extending through the first and second support substrates.

14. The acoustic wave filter component of claim 11 wherein the first boundary wave resonator is a surface acoustic wave device.

15. An acoustic wave filter component comprising:
a first boundary wave resonator supported by a first support substrate, the first boundary wave resonator including a first interdigital transducer electrode, the first interdigital transducer electrode located adjacent a first piezoelectric layer;
a second boundary wave resonator separated from the first boundary wave resonator by a second support substrate, the second boundary wave resonator including a second interdigital transducer electrode, the second interdigital transducer electrode located adjacent a second piezoelectric layer; and
a bulk acoustic wave resonator separated from the second boundary wave resonator by a third support substrate, the bulk acoustic wave resonator including a third piezoelectric layer and first and second electrodes on opposing sides of the third piezoelectric layer.

16. The acoustic wave filter component of claim 15 further comprising an internal via in electrical communication with the bulk acoustic wave resonator and the first boundary wave resonator, the internal via extending through the second and third support substrates.

17. The acoustic wave filter component of claim 15 wherein the first boundary wave resonator further includes a first high velocity layer located between the first piezoelectric layer and the first support substrate, a second high velocity layer located between the first piezoelectric layer and the second support substrate, and a low velocity layer located between the first piezoelectric layer and the second high velocity layer.

18. The acoustic wave filter component of claim 17 wherein the second boundary wave resonator further includes a third high velocity layer located between the second piezoelectric layer and the second support substrate, a fourth high velocity layer located between the second piezoelectric layer and the third support substrate, and a second low velocity layer located between the second piezoelectric layer and the fourth high velocity layer.

19. The acoustic wave filter component of claim 15 further comprising an external via in electrical communication with the bulk acoustic wave resonator, the external via extending through the first, second, and third support substrates.

* * * * *